(12) United States Patent
Hama et al.

(10) Patent No.: US 12,463,118 B2
(45) Date of Patent: Nov. 4, 2025

(54) SEMICONDUCTOR DEVICE

(71) Applicant: ROHM CO., LTD., Kyoto (JP)

(72) Inventors: Kenji Hama, Kyoto (JP); Yuji Ishimatsu, Kyoto (JP); Hideo Hara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 496 days.

(21) Appl. No.: 17/918,287

(22) PCT Filed: Mar. 31, 2021

(86) PCT No.: PCT/JP2021/013848
§ 371 (c)(1),
(2) Date: Oct. 11, 2022

(87) PCT Pub. No.: WO2021/210402
PCT Pub. Date: Oct. 21, 2021

(65) Prior Publication Data
US 2023/0178461 A1    Jun. 8, 2023

(30) Foreign Application Priority Data

Apr. 17, 2020 (JP) ................................ 2020-074232

(51) Int. Cl.
*H01L 23/00* (2006.01)
*H01L 23/495* (2006.01)
*H01L 25/065* (2023.01)

(52) U.S. Cl.
CPC .. *H01L 23/49555* (2013.01); *H01L 23/49575* (2013.01); *H01L 24/32* (2013.01);
(Continued)

(58) Field of Classification Search
CPC ......... H01L 23/49555; H01L 23/49575; H01L 24/32; H01L 24/48; H01L 24/73;
(Continued)

(56) References Cited

U.S. PATENT DOCUMENTS

2017/0154834 A1* 6/2017 Tonedachi ........ H01L 23/49541
2019/0051640 A1   2/2019 Yano et al.
2019/0199195 A1   6/2019 Akiyama

FOREIGN PATENT DOCUMENTS

CN    105207449    12/2015
JP    2010-56333 A  3/2010
(Continued)

OTHER PUBLICATIONS

Office Action received in the corresponding German Patent application, Nov. 24, 2022, and machine translation (13 pages).
(Continued)

*Primary Examiner* — Elias Ullah
(74) *Attorney, Agent, or Firm* — HSML P.C.

(57) ABSTRACT

A semiconductor device includes a substrate, a conductive portion, a sealing resin, a plurality of semiconductor chips, and a plurality of temperature detection elements. The substrate has a substrate obverse surface and a substrate reverse surface that face opposite sides in a thickness direction. The conductive portion is formed on the substrate obverse surface. The sealing resin covers at least a part of the substrate. The sealing resin also covers the entire conductive portion. The plurality of semiconductor chips are disposed
(Continued)

on the substrate obverse surface. The plurality of temperature detection elements are disposed on the substrate obverse surface. The number of temperature detection elements is equal to or greater than the number of semiconductor chips.

17 Claims, 14 Drawing Sheets

(52) U.S. Cl.
CPC .............. *H01L 24/48* (2013.01); *H01L 24/73* (2013.01); *H01L 25/0655* (2013.01); *H01L 2224/32104* (2013.01); *H01L 2224/48091* (2013.01); *H01L 2224/48247* (2013.01); *H01L 2224/73265* (2013.01); *H01L 2924/1811* (2013.01)

(58) Field of Classification Search
CPC ....... H01L 25/0655; H01L 2224/32104; H01L 2224/48091; H01L 2224/48247; H01L 2224/73265; H01L 2924/1811; H01L 25/072; H01L 23/49551; H01L 23/49568; H01L 2224/0603; H01L 2224/48139; H01L 2224/4903; H01L 2224/49111; H01L 2924/181; H01L 23/15; H01L 23/3735; H01L 23/4334; H01L 23/49531; H01L 23/49562; H01L 25/18

See application file for complete search history.

(56) References Cited

FOREIGN PATENT DOCUMENTS

| | | |
|---|---|---|
| JP | 2018-50433 A | 3/2018 |
| WO | 2013/046824 A1 | 4/2013 |
| WO | 2017/037780 A1 | 3/2017 |

OTHER PUBLICATIONS

International Search Report issued in PCT/JP2021/013848, Jun. 29, 2021 (2 pages).

Office Action issued in corresponding Japanese Patent application No. 2022-515296, Dec. 17, 2024, and machine translation (6 pages).

\* cited by examiner

SEMICONDUCTOR DEVICE

TECHNICAL FIELD

The present disclosure relates to a semiconductor device.

BACKGROUND ART

Conventionally, various semiconductor devices provided with switching elements have been proposed. For example, Patent Document 1 discloses a semiconductor device in which two switching elements that constitute a bridge circuit and a thermistor element are disposed on a substrate, and the thermistor element detects the temperature of the substrate.

The two switching elements that constitute the bridge circuit do not necessarily have the same current flowing through them, and there may be a temperature difference between the two switching elements. The temperature detected by the thermistor element is the temperature of the substrate, which is an average of the temperatures of the switching elements. Accordingly, if there is a temperature difference between the two switching elements, even if one of the switching elements exceeds a predetermined design temperature, this situation cannot be detected and this switching element may exhibit thermal runaway.

A switching element with a diode for detecting temperature in a chip has also been proposed. However, this configuration has a problem in that temperature detection is susceptible to noise caused by switching.

PRIOR ART DOCUMENTS

Patent Document

WO 2017/037780

SUMMARY OF THE INVENTION

Problem to be Solved by the Invention

In view of the above circumstances, an object of the present disclosure is to provide a semiconductor device in which temperature detection is not susceptible to noise caused by switching and that is capable of suppressing thermal runaway caused by uneven current.

Means for Solving the Problem

A semiconductor device provided according to a first aspect of the present disclosure includes: a substrate having a substrate obverse surface and a substrate reverse surface that face opposite sides in a thickness direction; a conductive portion formed on the substrate obverse surface; a sealing resin covering at least a part of the substrate and an entirety of the conductive portion; a plurality of semiconductor chips disposed on the substrate obverse surface; and a plurality of temperature detection elements mounted on the substrate obverse surface, where the number of temperature detection elements is equal to or greater than the number of semiconductor chips.

Advantages of the Invention

According to the semiconductor device of the present disclosure, a greater number of temperature detection elements than the number of semiconductor chips are utilized. Accordingly, the respective temperatures of the plurality of semiconductor chips can be detected by different temperature detection elements. This configuration makes it possible to separately compare the respective temperatures of the semiconductor chips with the design temperature even if the currents flowing through the semiconductor chips are uneven. Thus, thermal runaway can be suppressed. Further, the temperature detection elements are mounted on the substrate obverse surface, and are therefore less susceptible to noise caused by switching than a temperature detection unit incorporated within a semiconductor chip.

Further features and advantages of the present disclosure will become more apparent through the following detailed description with reference to the attached drawings.

MODE FOR CARRYING OUT THE INVENTION

Figure 1:
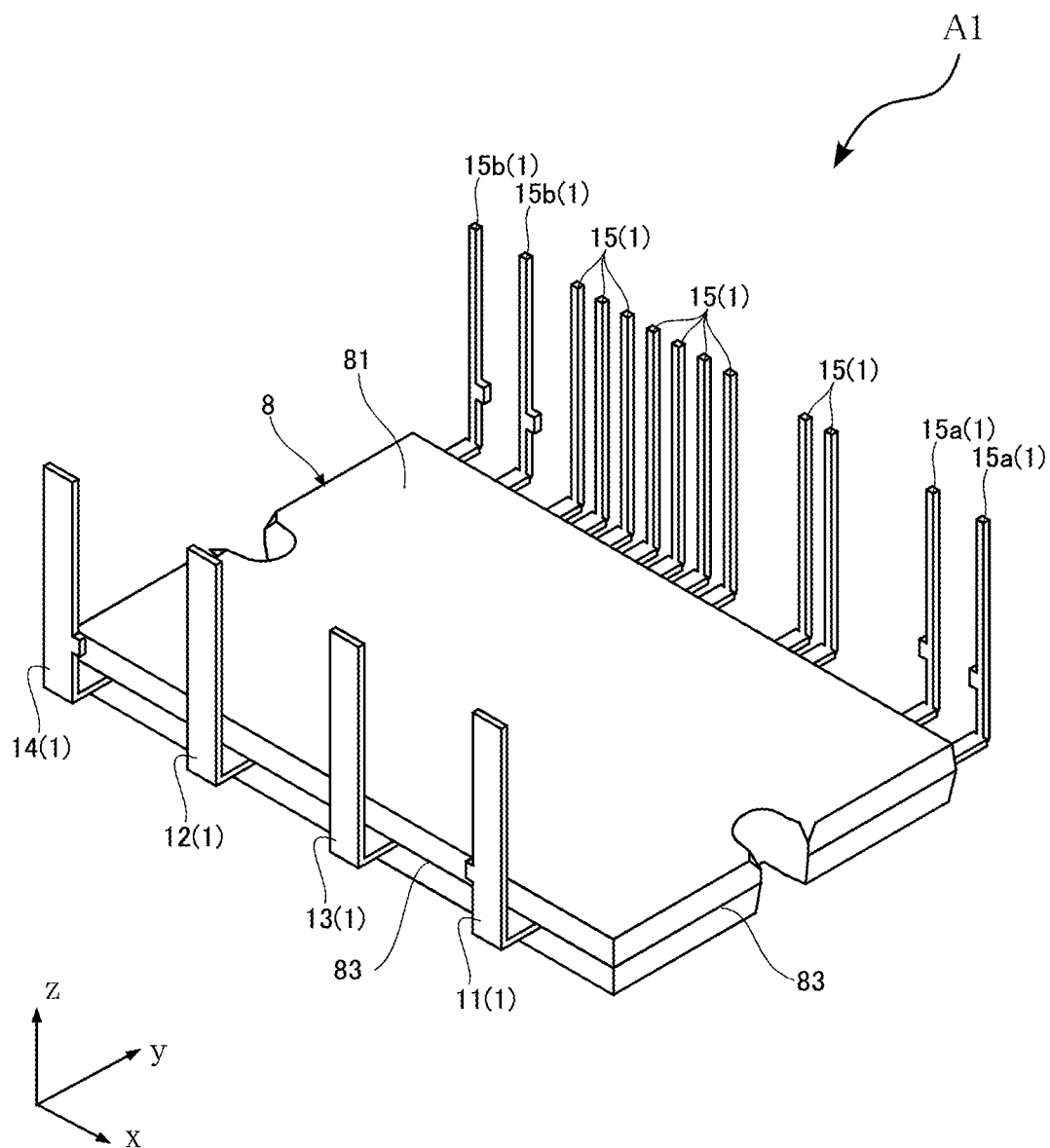
FIG. 1 is a perspective view of a semiconductor device according to a first embodiment of the present disclosure.

Hereinafter, preferable embodiments of the present disclosure will be described in detail with reference to the drawings.

In the present disclosure, "an object A being formed in an object B" and "the object A being formed on the object B" includes "the object A being directly formed in the object B" and "the object A being formed in the object B with another object interposed therebetween", unless otherwise noted. Similarly, "an object A being arranged in an object B" and "the object A being arranged on the object B" includes "the object A being directly arranged in the object B" and "the object A being arranged in the object B with another object interposed therebetween", unless otherwise stated. Similarly, "an object A being located on an object B" includes "the object A being located on the object B in contact with the object B" and "the object A being located on the object B with another object interposed therebetween", unless otherwise stated. Further, "an object A overlapping an object B as viewed in a direction" includes "the object A overlapping the entire object B" and "the object A partially overlapping the object B", unless otherwise stated.

FIGS. 1 to 8 show a semiconductor device according to the first embodiment of the present disclosure. A semiconductor device A1 of the present embodiment includes a plurality of leads 1, a substrate 2, a plurality of bonding portions 25, a conductive portion 3, two semiconductor chips 4, two protective elements 9, two control chips 5, a plurality of passive elements 6, a plurality of wires 71, a plurality of wires 72, a plurality of wires 73, a plurality of wires 74, and a sealing resin 8. In the present embodiment, the semiconductor device A1 is an IPM (Intelligent Power Module). The semiconductor device A1 is used, for example, in an air conditioner, a motor control device, or the like.

Figure 2:
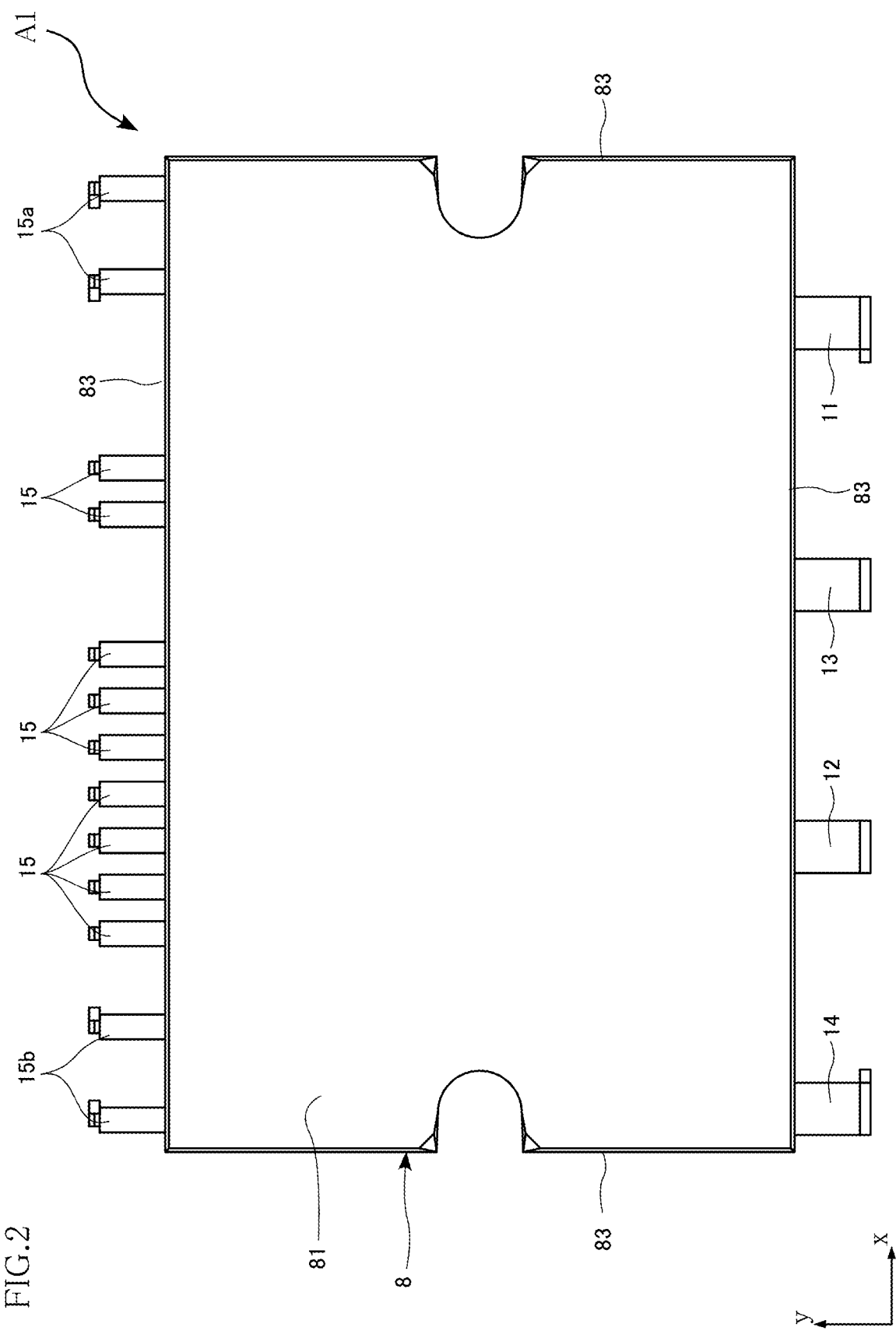
FIG. 2 is a plan view of the semiconductor device shown in FIG. 1.
Figure 3:
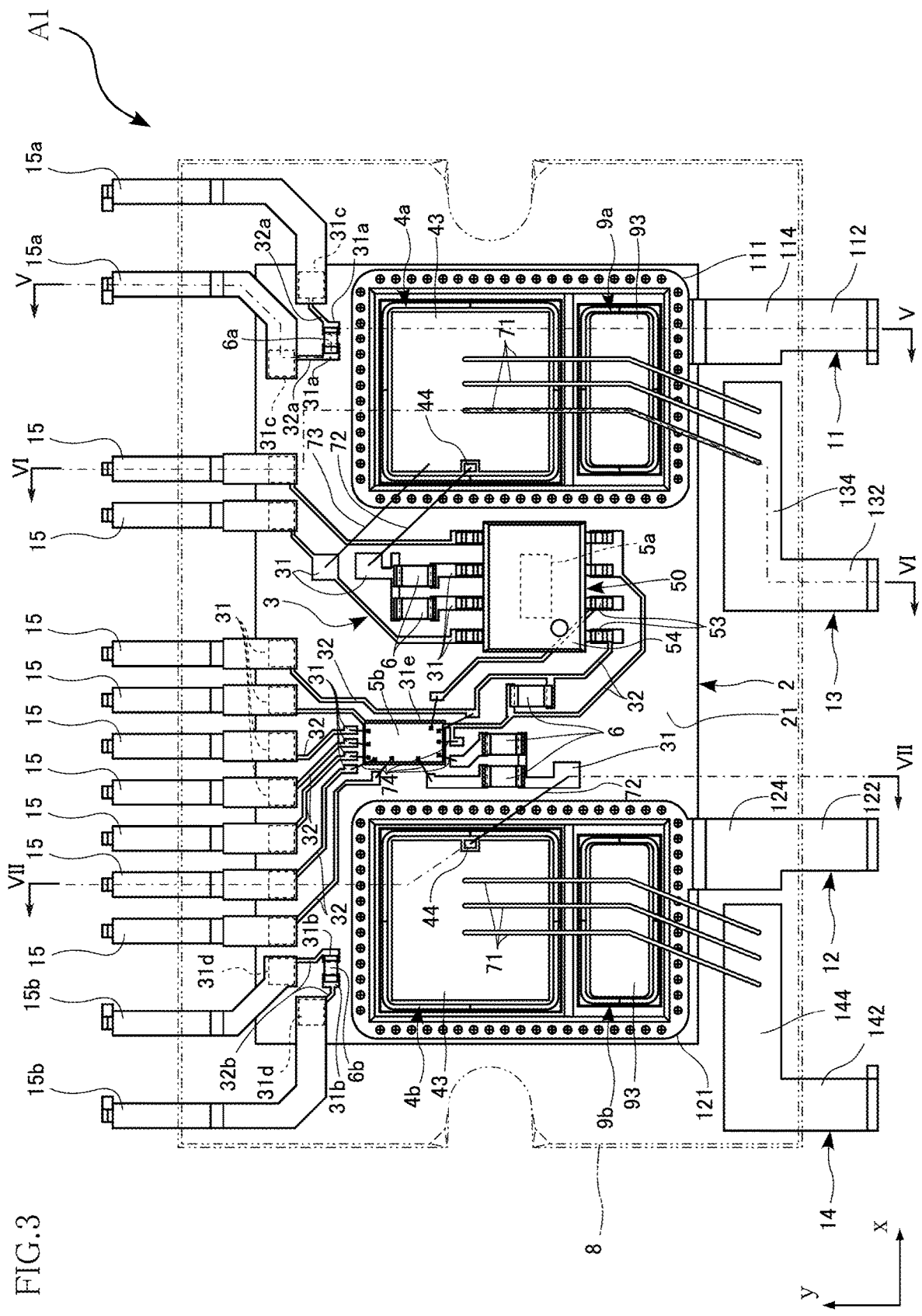
FIG. 3 is a plan view of the semiconductor device shown in FIG. 1, with a sealing resin shown in a transparent manner.
Figure 4:
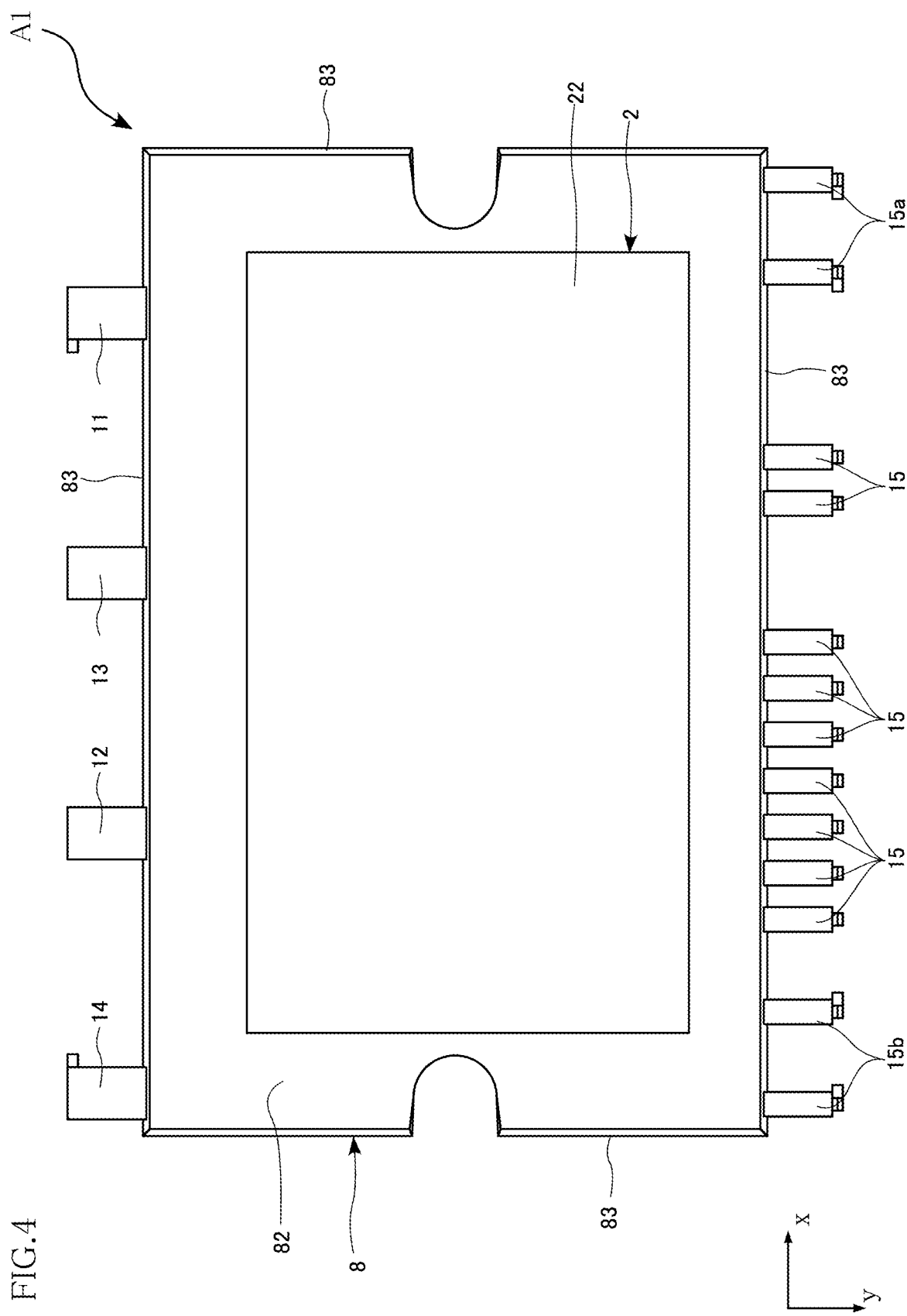
FIG. 4 is a bottom view of the semiconductor device shown in FIG. 1.
Figure 5:
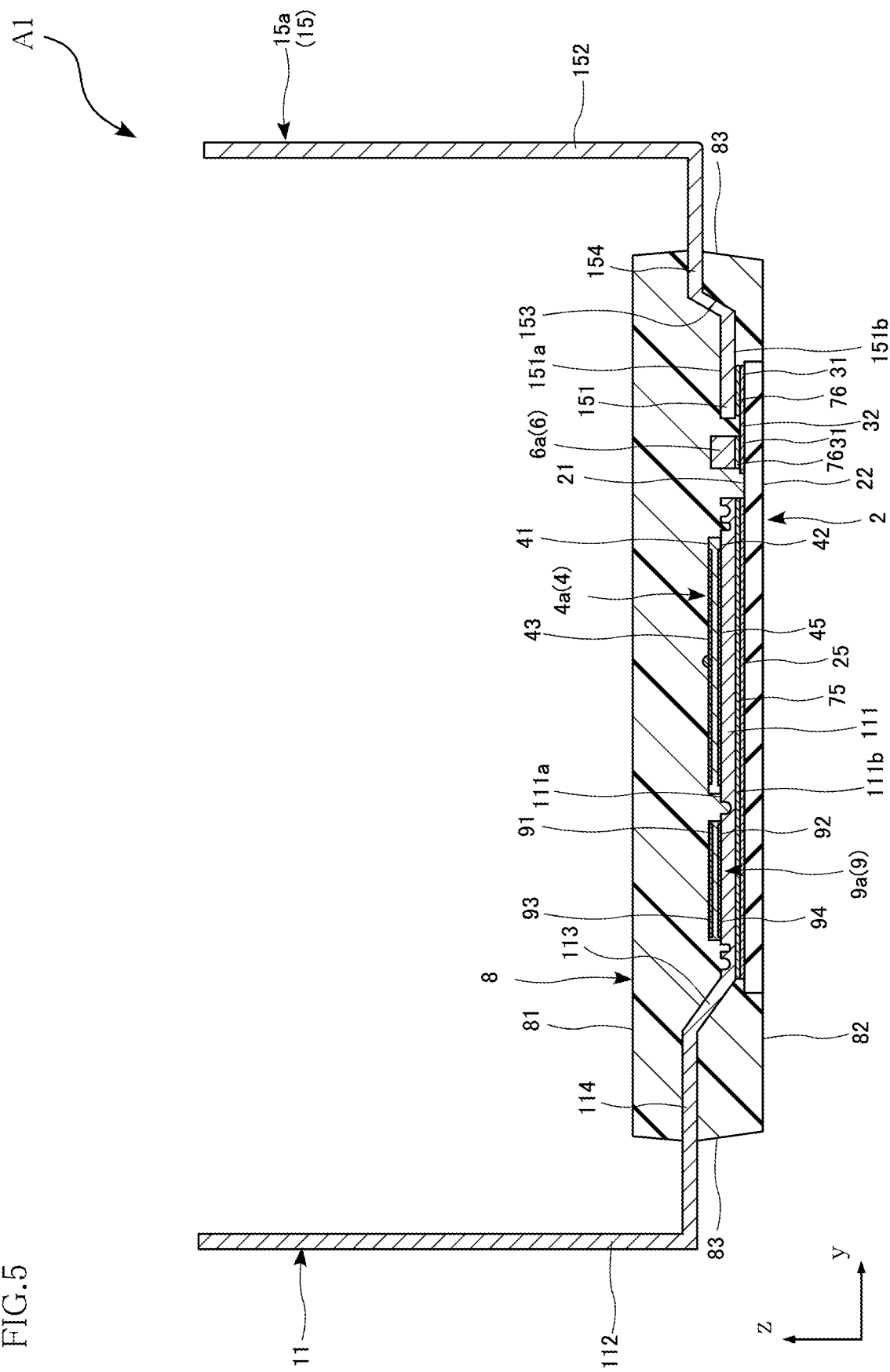
FIG. 5 is a cross-sectional view taken along a line V-V in FIG. 3.
Figure 6:
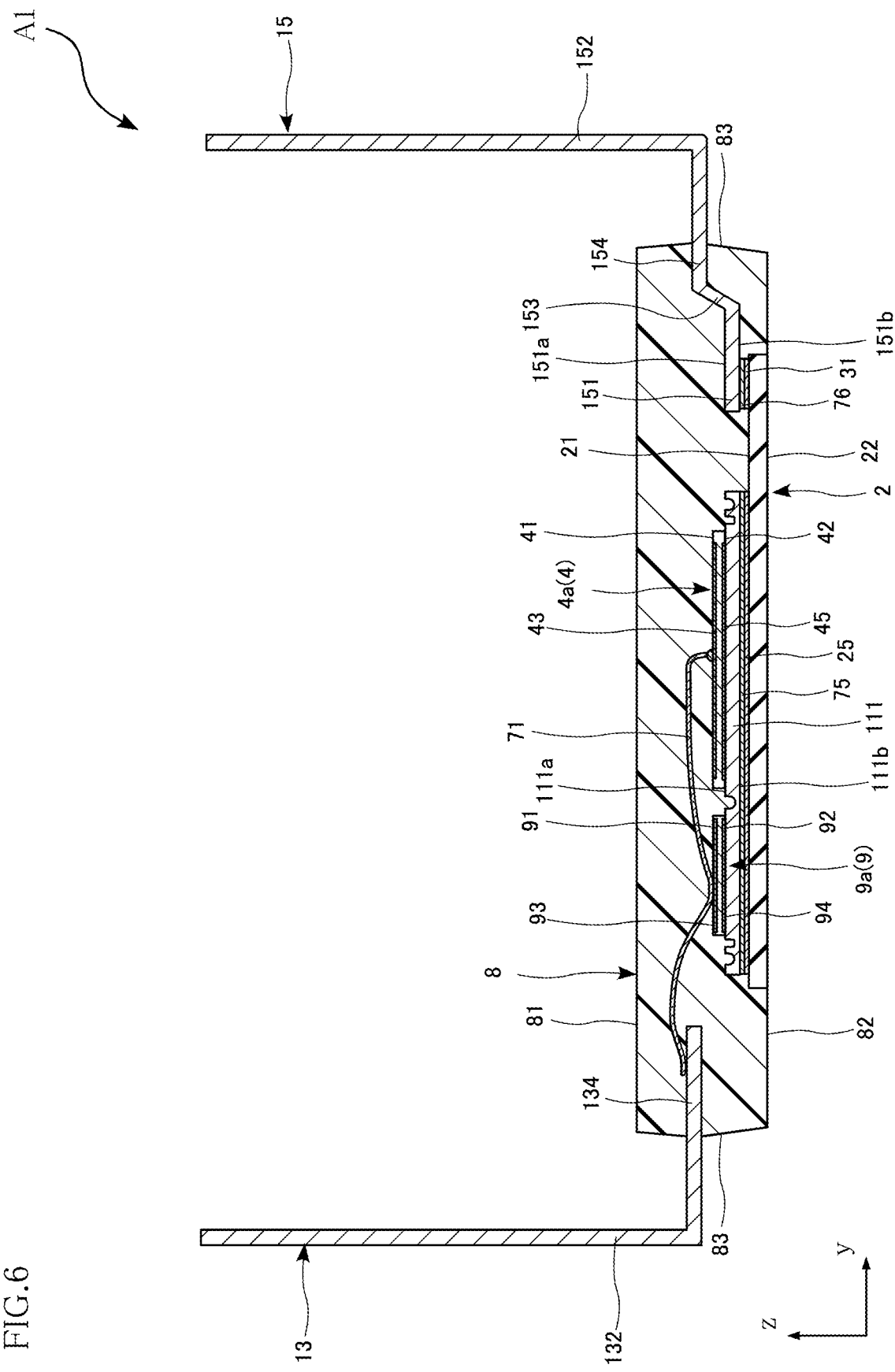
FIG. 6 is a cross-sectional view taken along a line VI-VI in FIG. 3.
Figure 7:
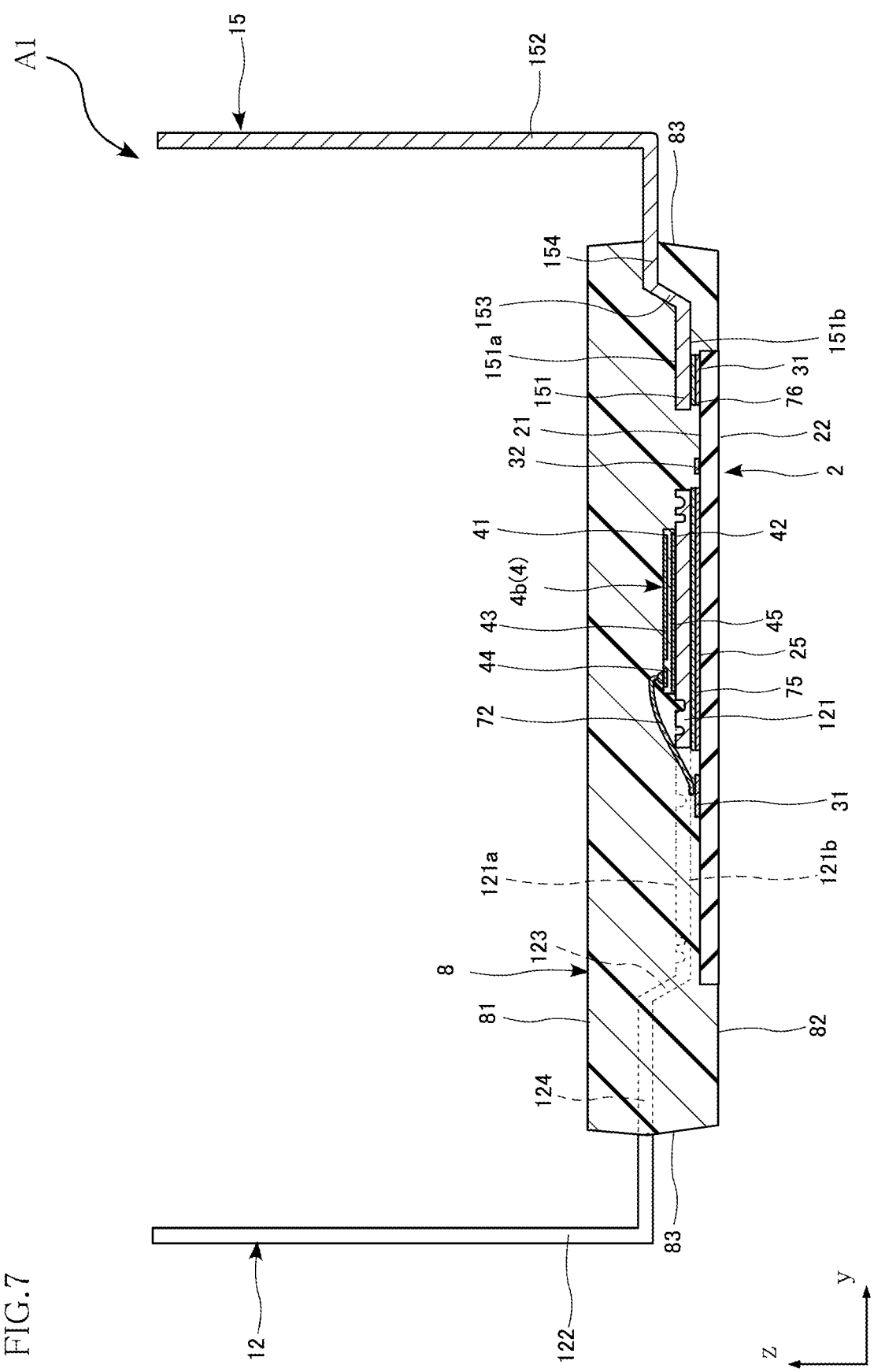
FIG. 7 is a cross-sectional view taken along a line VII-VII in FIG. 3.
Figure 8:
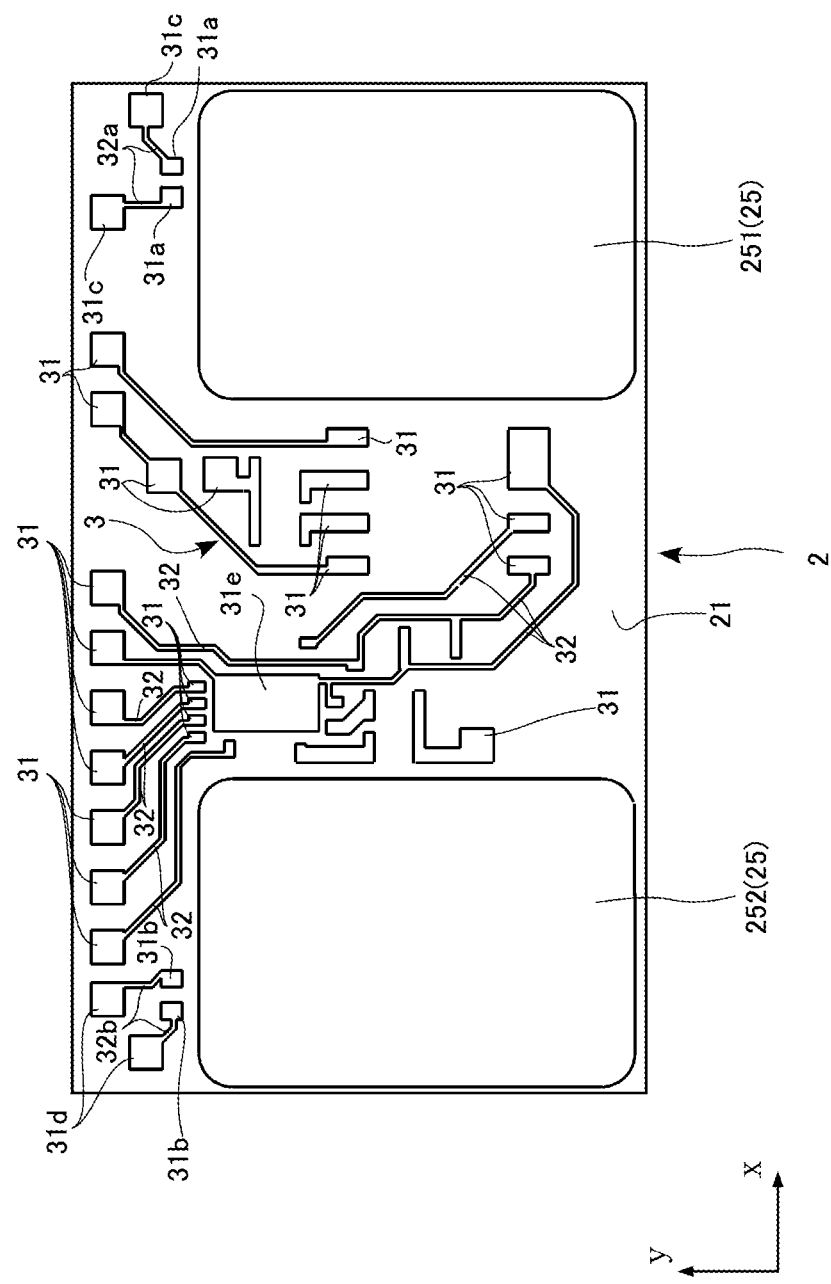
FIG. 8 is a plan view of a substrate of the semiconductor device shown in FIG. 1.

FIG. 1 is a perspective view of the semiconductor device A1. FIG. 2 is a plan view of the semiconductor device A1. FIG. 3 is a plan view of the semiconductor device A1, with the sealing resin 8 shown in a transparent manner. Note that FIG. 3 shows the outer shape of the sealing resin 8 with imaginary lines (dash-double dot lines). FIG. 4 is a bottom view of the semiconductor device A1. FIG. 5 is a cross-sectional view taken along a line V-V in FIG. 3. FIG. 6 is a cross-sectional view taken along a line VI-VI in FIG. 3. FIG. 7 is a cross-sectional view taken along a line VII-VII in FIG. 3. FIG. 8 is a plan view of the substrate 2.

For convenience of description, the thickness direction of the substrate 2 is referred to as the z direction, the direction parallel to one side of the substrate 2 that is orthogonal to the z direction (left-right direction in FIGS. 2 to 4) is referred to as the x direction, and the direction orthogonal to the z direction and the x direction (vertical direction in FIGS. 2 to 4) is referred to as the y direction.

The substrate 2 has a rectangular shape elongated in the x direction as viewed in the z direction (namely, "in a plan view"). The substrate 2 has a thickness (length in the z direction) of about 0.1 mm to 1.0 mm, for example. Note that the dimensions of the substrate 2 are not specifically limited. The substrate 2 is made of an insulating material. The material of the substrate 2 is not specifically limited. The material of the substrate 2 is, preferably, a material with a higher thermal conductivity than that of the material of the sealing resin 8, for example. Examples of the material of the substrate 2 include ceramics such as alumina ($Al_2O_3$), silicon nitride (SiN), aluminum nitride (AlN), and alumina containing zirconia.

The substrate 2 has a substrate obverse surface 21 and a substrate reverse surface 22. The substrate obverse surface 21 and the substrate reverse surface 22 are surfaces facing in opposite directions in the z direction, and are both flat surfaces that are orthogonal to the z direction. The substrate obverse surface 21 is a surface facing upward in FIGS. 5 to 7. The conductive portion 3 and the plurality of bonding portions 25 are formed and the plurality of leads 1 and a plurality of electronic components are mounted on the substrate obverse surface 21. The plurality of electronic components include the two semiconductor chips 4, the two protective elements 9, the two control chips 5, and the plurality of passive elements 6. The substrate reverse surface 22 is a surface facing downward in FIGS. 5 to 7. As shown in FIG. 4, the substrate reverse surface 22 is exposed from the sealing resin 8. The substrate obverse surface 21 and the substrate reverse surface 22 both have a rectangular shape. Note that the shape of the substrate 2 is not specifically limited.

The conductive portion 3 is formed on the substrate 2. In the present embodiment, the conductive portion 3 is formed on the substrate obverse surface 21 of the substrate 2. The conductive portion 3 is made of a conductive material. The conductive material that constitutes the conductive portion 3 is not specifically limited. Examples of the conductive materials of the conductive portion 3 include materials containing silver (Ag), copper (Cu), gold (Au), or the like, for example. The following description will take an example where the conductive portion 3 contains silver. Note that the conductive portion 3 may contain copper instead of silver, or may contain gold instead of silver or copper. Alternatively, the conductive portion 3 may contain Ag—Pt, Ag—Pd, or the like. The method for forming the conductive portion 3 is not specifically limited. For example, the conductive portion 3 is formed by sintering a paste containing these metals. The thickness of the conductive portion 3 is not specifically limited, and is, for example, about 5 μm to 30 μm.

The shape and other attributes of the conductive portion 3 are not specifically limited. In the present embodiment, the conductive portion 3 includes a plurality of pads 31 and a plurality of interconnects 32 as shown in FIG. 8, for example.

Each pad 31 has a rectangular shape, for example, and any of the leads 15 (described later), a control device 50 (described later), the passive elements 6, and the wires 72 to 74 is conductively bonded to the pad 31. Note that the shape of each pad 31 is not specifically limited. The pads 31 are arranged spaced apart from each other.

The plurality of pads 31 include two pads 31a, two pads 31b, two pads 31c, two pads 31d, and a pad 31e, as shown in FIGS. 3 and 8. The two pads 31a are arranged side by side in the x direction near the upper right corner of the substrate obverse surface 21, as shown in FIG. 8. Terminals of a thermistor 6a (described later) are bonded to the two pads 31a, as shown in FIG. 3. The two pads 31b are arranged side by side in the x direction near the upper left corner of the substrate obverse surface 21, as shown in FIG. 8. Terminals of a thermistor 6b (described later) are bonded to the two pads 31b, as shown in FIG. 3. The two pads 31c are arranged between the two pads 31a and an edge in the y direction of the substrate obverse surface 21 near the upper right corner of the substrate obverse surface 21, as shown in FIG. 8. Leads 15a (described later) are bonded to the two pads 31c, as shown in FIG. 3. The two pads 31d are arranged between the two pads 31b and an edge in the y direction of the substrate obverse surface 21 near the upper left corner of the substrate obverse surface 21, as shown in FIG. 8. Leads 15b (described later) are bonded to the two pads 31d, as shown in FIG. 3. The pad 31e is arranged near the center of the substrate obverse surface 21, as shown in FIG. 8. A control chip 5b (described later) is bonded to the pad 31e, as shown in FIG. 3.

Each interconnect 32 is connected to the plurality of pads 31 and serves as a conduction path between the connected pads 31. The plurality of interconnects 32 include two interconnects 32a and two interconnects 32b, as shown in FIGS. 3 and 8. Each interconnect 32a is connected to a pad 31a and a pad 31c. Each interconnect 32b is connected to a pad 31b and a pad 31d.

The plurality of bonding portions 25 are formed on the substrate 2, as shown in FIG. 8. In the present embodiment, the plurality of bonding portions 25 are formed closer to one side (lower side in FIG. 8) in the y direction of the substrate obverse surface 21 of the substrate 2. The material of the bonding portions 25 is not specifically limited, and is, for example, a material capable of bonding the substrate 2 to the leads 1. The bonding portions 25 are made of a conductive material, for example. The conductive material that constitutes the bonding portions 25 is not specifically limited. Examples of the conductive materials of the bonding portions 25 include materials containing silver (Ag), copper (Cu), gold (Au), or the like, for example. The following description will take an example where the bonding portions 25 contain silver. The bonding portions 25 in this example contain the same conductive material as that of the conductive portion 3. Note that the bonding portions 25 may contain copper instead of silver, or may contain gold instead of silver or copper. Alternatively, the bonding portions 25 may contain Ag—Pt, Ag—Pd, or the like. The method for forming the bonding portions 25 is not specifically limited. For example, the bonding portions 25 are formed by sintering a paste containing these metals, as the conductive portion 3 is. The thickness of the bonding portions 25 is not specifically limited, and is about 5 μm to 30 μm, for example.

In the present embodiment, the plurality of bonding portions 25 include bonding portions 251 and 252, as shown in FIG. 8. The bonding portions 251 and 252 are separated from each other. The bonding portion 251 is formed closer to one side in the x direction (right side in FIG. 8) when the substrate 2 is viewed in the z direction. A lead 11 (described later) is bonded to the bonding portions 251. The bonding portion 252 is formed closer to the other side in the x direction (left side in FIG. 8) when the substrate 2 is viewed in the z direction. A lead 12 (described later) is bonded to the bonding portions 252. Note that the shape and arrangement of the bonding portions 251 and 252 are not specifically limited.

The plurality of leads 1 contain metal, and have a higher thermal conductivity than that of the substrate 2, for example. The metal that constitutes the leads 1 is not specifically limited, and is, for example, copper (Cu), aluminum, iron (Fe), oxygen-free copper, or an alloy of these metals (e.g., Cu—Sn alloy, Cu—Zr alloy, Cu—Fe alloy etc.). The plurality of leads 1 may also be nickel (Ni) plated. The plurality of leads 1 may be formed, for example, by pressing a die against a metal plate, or by patterning a metal plate by means of etching. Note that the method for forming the plurality of leads 1 is not specifically limited. The thickness of each lead 1 is not specifically limited, and is about 0.4 to 0.8 mm, for example. The leads 1 are separated from each other.

In the present embodiment, the plurality of leads 1 include a lead 11, a lead 12, a lead 13, a lead 14, and a plurality of leads 15. The lead 11, the lead 12, the lead 13, and the lead 14 constitute conduction paths to the semiconductor chips 4, and protrude from a side of the semiconductor device A1 that faces one side in the y direction (lower side in FIGS. 2 and 3). The plurality of leads 15 constitute conduction paths to the control chips 5 or the passive elements 6, and protrude from a side face of the semiconductor device A1 that faces the other side in the y direction (upper side in FIGS. 2 and 3).

The lead 11 is arranged on the substrate 2. In the present embodiment, the lead 11 is arranged on the substrate obverse surface 21. The lead 11 is an example of a "first lead". The lead 11 is bonded to a bonding portion 25 via a bonding material 75. The bonding material 75 need only be capable of bonding the lead 11 to the bonding portion 25. From the viewpoint of efficiently transmitting heat from the lead 11 to the substrate 2, a bonding material 75 with higher thermal conductivity is preferable. For example, a silver paste, a copper paste, solder, or the like is used. However, the bonding material 75 may alternatively be an insulating material such as an epoxy resin or a silicone resin. If the bonding portions 25 are not formed in the substrate 2, the lead 11 may alternatively be bonded to the substrate 2.

The configuration of the lead 11 is not specifically limited. In the description of the present embodiment, the lead 11 is divided into a mounting portion 111, a protruding portion 112, an inclined connecting portion 113, and a parallel connecting portion 114, as shown in FIG. 5.

The mounting portion 111 has a substantially rectangle shape as viewed in the z direction, and has an obverse surface 111a and a reverse surface 111b. The obverse surface 111a and the reverse surface 111b are surfaces facing opposite sides in the z direction, and are both surfaces orthogonal to the z direction. The obverse surface 111a is a surface facing upward in FIGS. 5 and 6. A semiconductor chip 4a and a protective element 9a are mounted on the obverse surface 111a. The reverse surface 111b is a surface facing downward in FIGS. 5 to 7. The reverse surface 111b is bonded to the bonding portion 25 by the bonding material 75. The inclined connecting portion 113 and the parallel connecting portion 114 are covered by the sealing resin 8. The inclined connecting portion 113 is connected to the mounting portion 111 and the parallel connecting portion 114, and is inclined with respect to the mounting portion 111 and the parallel connecting portion 114. The parallel connecting portion 114 is connected to the inclined connecting portion 113 and the protruding portion 112, and is parallel to the mounting portion 111. The protruding portion 112 is continuous with an end of the parallel connecting portion 114, and is a portion of the lead 11 that protrudes from the sealing resin 8. The protruding portion 112 protrudes on the opposite side, in the y direction, to the mounting portion 111. The protruding portion 112 is used to electrically connect the semiconductor device A1 to an external circuit, for example. In the example shown in the figures, the protruding portion 112 is bent toward the side on which the obverse surface 111a of the mounting portion 111 faces in the z direction.

The lead 12 is arranged on the substrate 2. In the present embodiment, the lead 12 is arranged on the substrate obverse surface 21. The lead 12 is an example of a "second lead". The lead 12 is bonded to a bonding portion 25 via the bonding material 75. The configuration of the lead 12 is not specifically limited. In the description of the present embodiment, the lead 12 is divided into a mounting portion 121, a protruding portion 122, an inclined connecting portion 123, and a parallel connecting portion 124, as shown in FIG. 7.

The mounting portion 121 has a substantially rectangle shape as viewed in the z direction, and has an obverse surface 121a and a reverse surface 121b. The obverse surface 121a and the reverse surface 121b are surfaces facing opposite sides in the z direction, and are both surfaces orthogonal to the z direction. The obverse surface 121a is a surface facing upward in FIG. 7. A semiconductor chip 4b and a protective element 9b are mounted on the obverse surface 121a. The reverse surface 121b is a surface facing downward in FIG. 7. The reverse surface 121b is bonded to a bonding portion 25 by the bonding material 75. The inclined connecting portion 123 and the parallel connecting portion 124 are covered by the sealing resin 8. The inclined connecting portion 123 is connected to the mounting portion 121 and the parallel connecting portion 124, and is inclined with respect to the mounting portion 121 and the parallel connecting portion 124. The parallel connecting portion 124 is connected to the inclined connecting portion 123 and the protruding portion 122, and is parallel to the mounting portion 121. The protruding portion 122 is continuous with an end of the parallel connecting portion 124, and is a portion of the lead 12 that protrudes from the sealing resin 8. The protruding portion 122 protrudes on the opposite side, in the y direction, to the mounting portion 121. The protruding portion 122 is used to electrically connect the semiconductor device A1 to an external circuit, for example. In the example shown in the figures, the protruding portion 122 is bent toward the side on which the obverse surface 121*a* of the mounting portion 121 faces in the z direction.

In the present embodiment, the lead 13 is not arranged on the substrate 2, and is supported by the sealing resin 8. The lead 13 does not include portions corresponding to the mounting portion 111 and the inclined connecting portion 113 of the lead 11. Note that the configuration of the lead 13 is not limited thereto. In the description of the present embodiment, the lead 13 is divided into a protruding portion 132 and a wire bonding portion 134, as shown in FIG. 6.

The wire bonding portion 134 is covered by the sealing resin 8. Wires 71 are bonded to the wire bonding portion 134. The protruding portion 132 is continuous with an end of the wire bonding portion 134, and is a portion of the lead 13 that protrudes from the sealing resin 8. The protruding portion 132 protrudes toward the opposite side, in the y direction, to the mounting portion 111 of the lead 11. The protruding portion 132 is used to electrically connect the semiconductor device A1 to an external circuit, for example. In the example shown in the figures, the protruding portion 132 is bent toward the side on which the obverse surface 111*a* of the lead 11 faces in the z direction.

In the present embodiment, the lead 14 is not arranged on the substrate 2, and is supported by the sealing resin 8. The lead 14 has the same configuration as that of the lead 13. Note that the configuration of the lead 14 is not limited thereto. In the description of the present embodiment, the lead 14 is divided into a protruding portion 142 and a wire bonding portion 144.

The wire bonding portion 144 is covered by the sealing resin 8. Wires 71 are bonded to the wire bonding portion 144. The protruding portion 142 is continuous with an end of the wire bonding portion 144, and is a portion of the lead 14 that protrudes from the sealing resin 8. The protruding portion 142 protrudes toward the opposite side, in the y direction, to the mounting portion 111 of the lead 11. The protruding portion 142 is used to electrically connect the semiconductor device A1 to an external circuit, for example. In the example shown in the figures, the protruding portion 142 is bent toward the side on which the obverse surface 111*a* of the lead 11 faces in the z direction.

The plurality of leads 15 are arranged on the substrate 2. In the present embodiment, the plurality of leads 15 are arranged on the substrate obverse surface 21. Each lead 15 is an example of a "control lead". The leads 15 are bonded to respective pads 31 the conductive portion 3 via a conductive bonding material 76. The conductive bonding material 76 need only be capable of bonding the leads 15 to the pads 31 and electrically connecting the leads 15 to the pads 31. The conductive bonding material 76 is, for example, a silver paste, a copper paste, solder, or the like.

The configuration of the leads 15 is not specifically limited. In the description of the present embodiment, each lead 15 is divided into a bonding section 151, a protruding portion 152, an inclined connecting portion 153, and a parallel connecting portion 154, as shown in FIGS. 5 to 7.

The bonding section 151 has an obverse surface 151*a* and a reverse surface 151*b*. The obverse surface 151*a* and the reverse surface 151*b* are surfaces facing opposite sides in the z direction, and are both surfaces orthogonal to the z direction. The obverse surface 151*a* is a surface facing upward in FIGS. 5 to 7. The reverse surface 151*b* is a surface facing downward in FIGS. 5 to 7. The reverse surface 151*b* is bonded to a pad 31 by the conductive bonding material 76. The inclined connecting portion 153 and the parallel connecting portion 154 are covered by the sealing resin 8. The inclined connecting portion 153 is connected to the bonding section 151 and the parallel connecting portion 154, and is inclined with respect to the bonding section 151 and the parallel connecting portion 154. The parallel connecting portion 154 is connected to the inclined connecting portion 153 and the protruding portion 152, and is parallel to the bonding section 151. The protruding portion 152 is continuous with an end of the parallel connecting portion 154, and is a portion of the lead 15 that protrudes from the sealing resin 8. The protruding portion 152 protrudes on the opposite side, in the y direction, to the bonding section 151. The protruding portion 152 is used to electrically connect the semiconductor device A1 to an external circuit, for example. In the example shown in the figures, the protruding portion 152 is bent toward the side on which the obverse surface 151*a* of the bonding portion 151 faces in the z direction.

In the present embodiment, the plurality of leads 15 include two leads 15*a* and two leads 15*b*. The two leads 15*a* are conductively bonded to different pads 31*c*. The two leads 15*b* are conductively bonded to different pads 31*d*.

Each of the two semiconductor chips 4 is arranged on one of the leads 1. When the two semiconductor chips 4 are distinguished, one is referred to as a semiconductor chip 4*a* and the other as a semiconductor chip 4*b*. When the two semiconductor chips 4 are not distinguished, they are referred to simply as the semiconductor chip(s) 4. The type and the function of the semiconductor chips 4 are not specifically limited. The present embodiment will describe an example of the case where the semiconductor chips 4 are power transistors for controlling power. Each semiconductor chip 4 is, for example, a MOSFET (metal-oxide-semiconductor field-effect transistor) that includes a SiC (silicon carbide) substrate. Note that each semiconductor chip 4 may alternatively be a MOSFET that includes a Si (silicon) substrate instead of a SiC substrate, and may include an IGBT element, for example. Further, each semiconductor chip 4 may alternatively be a MOSFET that contains GaN (gallium nitride).

Each semiconductor chip 4 has a rectangular plate-like shape as viewed in the z direction, and includes an element obverse surface 41, an element reverse surface 42, a source electrode 43, a gate electrode 44, and a drain electrode 45. The element obverse surface 41 and the element reverse surface 42 face opposite sides in the z direction. The element obverse surface 41 is a surface facing upward in the FIGS. 5 to 7. The element reverse surface 42 faces downward in FIGS. 5 to 7. The source electrode 43 and the gate electrode 44 are arranged on the element obverse surface 41, as shown in FIG. 3. The drain electrode 45 is arranged on the element reverse surface 42, as shown in FIGS. 5 to 7. Note that the shape and the arrangement of the source electrode 43, the gate electrode 44, and the drain electrode 45 are not specifically limited.

The semiconductor chip 4*a* is arranged on the lead 11, as shown in FIGS. 3, 5, and 6. The semiconductor chip 4*a* is bonded to the lead 11 by a conductive bonding material (not shown) with the element reverse surface 42 facing toward the lead 11, as shown in FIGS. 5 and 6. Thus, the drain electrode 45 of the semiconductor chip 4a is conductively connected to the lead 11 by the conductive bonding material. The conductive bonding material is, for example, a silver paste, a copper paste, solder, or the like. The source electrode 43 of the semiconductor chip 4a is conductively connected to the lead 13 by wires 71, as shown in FIG. 3. The wires 71 are made of aluminum (Al), copper (Cu), or the like, for example. Note that the material, the wire diameter, and the number of wires 71 are not specifically limited. The semiconductor chip 4b is arranged on the lead 12, as shown in FIGS. 3 and 7. The semiconductor chip 4b is bonded to the lead 12 by a conductive bonding material (not shown) with the element reverse surface 42 facing toward the lead 12, as shown in FIG. 7. Thus, the drain electrode 45 of the semiconductor chip 4b is conductively connected to the lead 12 by the conductive bonding material. The source electrode 43 of the semiconductor chip 4b is conductively connected to the lead 14 by wires 71, as shown in FIG. 3.

The gate electrode 44 of the semiconductor chip 4a is connected to the conductive portion 3 by the wires 72 and is conductively connected to the control chip 5a, as shown in FIG. 3. The source electrode 43 of the semiconductor chip 4a is connected to the conductive portion 3 by the wires 73 and is conductively connected to the control chip 5a. The wires 72 and 73 are made of gold (Au), silver (Ag), copper (Cu), aluminum (Al), or the like, for example. Note that the material, the wire diameter, and the number of wires 72 and 73 are not specifically limited. The control chip 5a inputs a drive signal to the gate electrode 44 of the semiconductor chip 4a. The gate electrode 44 of the semiconductor chip 4b is connected to the conductive portion 3 by the wires 72 and is conductively connected to the control chip 5b. The control chip 5b inputs a drive signal to the gate electrode 44 of the semiconductor chip 4b.

The semiconductor chip A1 has the leads 12 and 13 that are conductively connected outside the device, and is used as a bridge circuit with the semiconductor chip 4a serving as a switching element at the upstream stage and the semiconductor chip 4b serving as a switching element at the downstream stage. In this case, a DC voltage is applied between the lead 11 and the lead 14, and the semiconductor device A1 outputs, from the lead 12, a switching signal whose voltage switches in accordance with a drive signal by inputting the drive signal to the gate electrodes 44 of the semiconductor chips 4a and 4b.

The two protective elements 9 are arranged on respective leads 1. When the two protective elements 9 are distinguished, one is referred to as a protective element 9a and the other as a protective element 9b. When the two protective elements 9 are not distinguished, they are referred to simply as the protective element(s) 9. The type and the function of the protective elements 9 are not specifically limited. The present embodiment will describe an example of the case where the protective elements 9 are diodes for preventing a reverse voltage from being applied to the semiconductor chips 4.

Each protective element 9 has a rectangular plate-like shape as viewed in the z direction, and includes a protective element obverse surface 91, a protective element reverse surface 92, an anode electrode 93, and a cathode electrode 94. The protective element obverse surface 91 and the protective element reverse surface 92 face opposite sides in the z direction. The protective element obverse surface 91 is a surface facing upward in the FIGS. 5 and 6. The protective element reverse surface 92 faces downward in FIGS. 5 and 6. The anode electrode 93 is arranged on the protective element obverse surface 91, as shown in FIG. 3. The cathode electrode 94 is arranged on the protective element reverse surface 92, as shown in FIGS. 5 and 6. Note that the shape and the arrangement of the anode electrode 93 and the cathode electrode 94 are not specifically limited.

The protective element 9a is arranged on the lead 11 on one side in the y direction (lower side in FIG. 3) of the semiconductor chip 4a, as shown in FIGS. 3, 5, and 6. The protective element 9a is bonded to the lead 11 by a conductive bonding material (not shown) with the protective element reverse surface 92 facing toward the lead 11, as shown in FIGS. 5 and 6. Thus, the cathode electrode 94 of the protective element 9a is conductively connected to the lead 11 by the conductive bonding material. The conductive bonding material is, for example, a silver paste, a copper paste, solder, or the like. The cathode electrode 94 of the protective element 9a is conductively connected to the drain electrode 45 of the semiconductor chip 4a via the lead 11. Further, the anode electrode 93 of the protective element 9a is conductively connected to the semiconductor chip 4a and the lead 13 by wires 71, as shown in FIG. 3. In the present embodiment, these wires 71 each have one end bonded to the source electrode 43 of the semiconductor chip 4a, an intermediate portion bonded to the anode electrode 93 of the protective element 9a, and the other end bonded to the lead 13. Note that the source electrode 43 may alternatively be connected to the anode electrode 93 by wires 71, and the anode electrode 93 may be connected to the lead 13 by other wires 71. Further, the source electrode 43 may be connected to the lead 13 by wires 71, and the anode electrode 93 may be connected to the lead 13 by other wires 71. As described above, the protective element 9a is connected to the semiconductor chip 4a in inverse parallel.

The protective element 9b is arranged on the lead 12 on one side in the y direction (lower side in FIG. 3) of the semiconductor chip 4b, as shown in FIG. 3. The protective element 9b is bonded to the lead 12 by a conductive bonding material (not shown) with the protective element reverse surface 92 facing toward the lead 12. Thus, the cathode electrode 94 of the protective element 9b is conductively connected to the lead 12 by the conductive bonding material. The cathode electrode 94 of the protective element 9b is conductively connected to the drain electrode 45 of the semiconductor chip 4b via the lead 12. Further, the anode electrode 93 of the protective element 9b is conductively connected to the semiconductor chip 4b and the lead 14 by wires 71, as shown in FIG. 3. In the present embodiment, these wire 71 each have one end bonded to the source electrode 43 of the semiconductor chip 4b, an intermediate portion bonded to the anode electrode 93 of the protective element 9b, and the other end bonded to the lead 14. Note that the source electrode 43 may alternatively be connected to the anode electrode 93 by wires 71, and the anode electrode 93 may be connected to the lead 14 by other wires 71. Further, the source electrode 43 may be connected to the lead 14 by wires 71, and the anode electrode 93 may be connected to the lead 13 by other wires 71. As described above, the protective element 9b is connected to the semiconductor chip 4b in inverse parallel. Note that the semiconductor device A1 need not have the protective elements 9.

The two control chips 5 are for controlling the driving of the semiconductor chips 4, and are arranged on the substrate obverse surface 21 of the substrate 2. When the two control chips 5 are distinguished, one is referred to as a control chip 5a and the other as a control chip 5b. When the two control chips 5 are not distinguished, they are referred to simply as the control chip(s) 5.

The control chips 5a and 5b are arranged between the leads 11 and 12, spaced apart from the leads 11 and 12, as shown in FIG. 3. The control chip 5a is located closer to the lead 11, and the control chip 5b is located closer to the lead 12. Note that the arrangement of the control chips 5a and 5b is not specifically limited.

The control chip 5a controls the drive of the semiconductor chip 4a. Specifically, the control chip 5a generates a drive signal and inputs the generated drive signal to the gate electrode 44 of the semiconductor chip 4a, thereby driving the semiconductor chip 4a. In the present embodiment, the control chip 5a constitutes a control device 50 together with a die pad and a plurality of wires (not shown), as well as a plurality of leads 53 and a resin 54. The die pad and the plurality of leads 53 are plate-like members made of copper (Cu), for example. The control chip 5a is mounted on the die pad. Each lead 53 are electrically continuous with the control chip 5a through a wire. The resin 54 covers the control chip 5a, the entire wires, and a part of each lead 53, and is made of an insulating material such as an epoxy resin or a silicone gel, for example. The leads 53 are arranged on both ends in the y direction of the resin 54, spaced apart from each other in the x direction, as shown in FIG. 3. The leads 53 extend in the y direction, and a part of each lead 53 protrudes from one of the two side faces in the y direction of the resin 54. The portion of each lead 53 that protrudes from the resin 54 is conductively bonded to a corresponding pad 31 of the conductive portion 3. In the present embodiment, the control device 50 is a SOP (Small Outline Package) package. Note that the package type of the control device 50 is not limited to the SOP type, and may alternatively be, for example, any other type of package such as the QFP (Quad Flat Package) type or the SOJ (Small Outline J-lead Package) type. Note that the size and the shape of the control device 50, the number of leads, and so on, are not specifically limited. The control device 50 may also include a circuit chip other than the control chip 5a.

The control chip 5b controls the drive of the semiconductor chip 4b. Specifically, the control chip 5b generates a drive signal and inputs the generated drive signal to the gate electrode 44 of the semiconductor chip 4b, thereby driving the semiconductor chip 4b. In the present embodiment, the control chip 5b is arranged as-is on the substrate obverse surface 21. The control chip 5b has one face bonded to the pads 31c, and a plurality of electrodes arranged on the other face are conductively connected to respective pads 31 by wires 74. The wires 74 are made of gold (Au), silver (Ag), copper (Cu), aluminum (Al), or the like, for example. Note that the material, the wire diameter, and the number of wires 74 are not specifically limited.

Note that the control chip 5a may alternatively be arranged as-is on the substrate obverse surface 21, as the control chip 5b is. Alternatively, the control chip 5b may be arranged as the control device 50 on the substrate obverse surface 21, as the control chip 5a is.

The plurality of passive elements 6 are arranged on the substrate obverse surface 21 of the substrate 2, and are conductively bonded to the pads 31 of the conductive portion 3. The passive elements 6 are, for example, resistors, capacitors, coils, diodes, or the like. The passive elements 6 include a thermistor 6a and a thermistor 6b.

The thermistors 6a and 6b are temperature detection elements and are mounted on the substrate obverse surface 21 of the substrate 2. The thermistors 6a and 6b are resistors whose electrical resistance greatly changes in response to temperature changes, and the voltage across terminals changes as the resistance value changes in response to the surrounding temperature. The temperature around the thermistors 6a and 6b is detected based on the voltage across the terminals of the thermistors 6a and 6b. Note that the characteristics of the thermistors 6a and 6b are not specifically limited. The thermistors 6a and 6b may be NTC (negative temperature coefficient) thermistors, PTC (Positive temperature coefficient) thermistors, or may be thermistors with any other characteristics.

The thermistor 6a is for detecting the temperature of the semiconductor chip 4a, and is arranged adjacent to the mounting portion 111 of the lead 11 on which the semiconductor chip 4a is mounted, as shown in FIG. 3. The thermistor 6a is insulated from the lead 11. The thermistor 6a spans between the two pads 31a of the conductive portion 3. One terminal of the thermistor 6a is conductively bonded to one pad 31a, and the other terminal is conductively bonded to the other pad 31a. Each pad 31a is conductively connected to the respective leads 15a via the interconnects 32a and the pads 31c. That is, the pads 31a, the interconnects 32a, and the pads 31c are conduction paths that allow the thermistor 6a to be electrically continuous with the leads 15a. The two leads 15a serve as terminals for detecting the temperature of the semiconductor chip 4a and output the voltage across the terminals of the thermistor 6a. In the present embodiment, the thermistor 6a is an example of a "first temperature detection element".

The thermistor 6b is for detecting the temperature of the semiconductor chip 4b, and is arranged adjacent to the NC mounting portion 121 of the lead 12 on which the semiconductor chip 4b is mounted, as shown in FIG. 3. The thermistor 6b is insulated from the lead 12. The thermistor 6b spans between the two pads 31b of the conductive portion 3. One terminal of the thermistor 6b is conductively bonded to one pad 31b, and the other terminal is conductively bonded to the other pad 31b. Each pad 31b is conductively connected to the respective leads 15b via the interconnects 32b and the pads 31d. That is, the pads 31b, the interconnects 32b, and the pads 31d are conduction paths that allow the thermistor 6b to be electrically continuous with the leads 15b. The two leads 15b serve as terminals for detecting the temperature of the semiconductor chip 4b and output the voltage across the terminals of the thermistor 6b. In the present embodiment, the thermistor 6b is an example of a "second temperature detection element".

Note that the semiconductor device A1 may have any other have temperature detection elements instead of the thermistors 6a and 6b. Other temperature detection elements may be semiconductor temperature sensors. A semiconductor temperature sensor is a Si diode, whose forward voltage greatly changes in response to temperature changes, or the like, and detects the surrounding temperature based on the voltage across the terminals when a predetermined current is applied.

The other passive elements 6 are conductively bonded to the pads 31 of the conductive portion 3, and are electrically continuous with NC the control chips 5 or the semiconductor chips 4 via the interconnects 32 and the pads 31. Note that the type and the number of passive elements 6 and the positions at which the passive elements 6 are arranged are not specifically limited.

The sealing resin 8 at least partially covers the semiconductor chips 4a and 4b, the protective elements 9a and 9b, the control device 50 (control chip 5a), the control chip 5b, the plurality of passive elements 6, the wires 71 to 74, the plurality of leads 1, and the substrate 2. The material of the sealing resin 8 is not specifically limited. For example, an insulating material such as an epoxy resin or a silicone gel is used as appropriate.

The sealing resin 8 has a resin obverse surface 81, a resin reverse surface 82, and four resin side surfaces 83. The resin obverse surface 81 and the resin reverse surface 82 face opposite sides in the z direction, and are both flat surfaces orthogonal to the z direction. The resin obverse surface 81 is a surface facing upward in FIGS. 5 to 7. The resin reverse surface 82 is a surface facing downward in FIGS. 5 to 7. The resin side surfaces 83 are continuous with the resin obverse surface 81 and the resin reverse surface 82, and face in the x direction or the y direction. The substrate reverse surface 22 of the substrate 2 is exposed from the resin reverse surface 82 of the sealing resin 8, as shown in FIG. 4. In the present embodiment, the substrate reverse surface 22 is flush with the resin reverse surface 82, as shown in FIGS. 5 to 7.

Next, an example of a method for producing the semiconductor device A1 will be described below with reference to FIG. 9. Note that the production method described below is one means for realizing the semiconductor device A1, and the present disclosure is not limited thereto.

Figure 9:
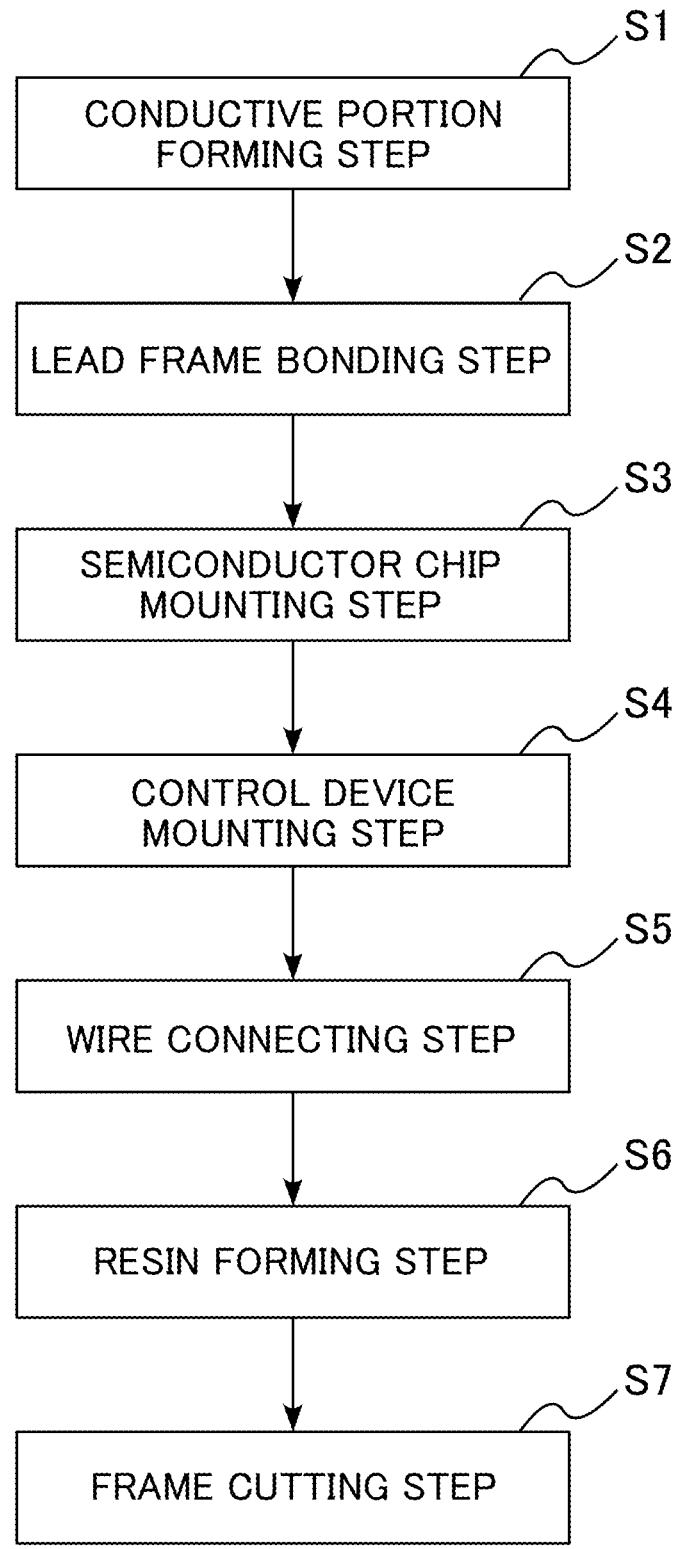
FIG. 9 is a flowchart showing some steps in one example of a method for producing the semiconductor device shown in FIG. 1.

As shown in FIG. 9, the production method of this example has a conductive portion forming step (step S1), a lead frame bonding step (step S2), a semiconductor chip mounting step (step S3), a control device mounting step (step S4), a wire connecting step (step S5), a resin forming step (step S6), and a frame cutting step (step S7).

In the conductive portion forming step (step S1), first, the substrate 2 is prepared. The substrate 2 is made of ceramic, for example. Next, the conductive portion 3 and the plurality of bonding portions 25 are formed on the substrate obverse surface 21 of the substrate 2. In this example, the conductive portion 3 and the plurality of bonding portions 25 are collectively formed. For example, the conductive portion 3 and the plurality of bonding portions 25 that contain a metal such as silver (Ag) serving as a conductive material can be obtained by printing a metal paste and then sintering it.

In the lead frame bonding step (step S2), first, a bonding paste is printed on the plurality of bonding portions 25, and a conductive bonding paste is printed on some of the pads 31 of the conductive portion 3. The bonding paste and the conductive bonding paste are, for example, an Ag paste, a solder paste, or the like. Next, a lead frame is prepared. The lead frame includes a plurality of leads 1, and have a frame to which the plurality of leads 1 are connected. Note that the shape or the like of the lead frame is not limited in any way. Next, the leads 11 and 12, of the plurality of leads 1, are made to face the plurality of bonding portions 25 via the bonding paste. Also, the plurality of leads 15, of the plurality of leads 1, are made to face the conductive portion 3 (pads 31) via the conductive bonding paste. For example, the bonding material 75 is formed by the bonding paste and the conductive bonding material 76 is formed by the conductive bonding paste by heating and then cooling the bonding paste and the conductive bonding paste. Thus, the leads 11 and 12 are bonded to the plurality of bonding portions 25 via the bonding material 75, and the plurality of leads 15 are bonded to the conductive portion 3 via the conductive bonding material 76.

In the semiconductor chip mounting step (step S3), first, a conductive bonding paste is printed at predetermined positions on the leads 11 and 12. The conductive bonding paste is, for example, an Ag paste, a solder paste, or the like. Next, the semiconductor chip 4a and the protective element 9a are attached to the conductive bonding paste printed on the lead 11, and the semiconductor chip 4b and the protective element 9b are attached to the conductive bonding paste printed on the lead 12. Then, the conductive bonding material is formed by the conductive bonding paste by heating and then cooling the conductive bonding paste, for example. Thus, the semiconductor chip 4a and the protective element 9a are bonded to the lead 11 via the conductive bonding material, and the semiconductor chip 4b and the protective element 9b are bonded to the lead 12 via the conductive bonding material.

In the control device mounting step (step S4), a conductive bonding paste is printed on some of the pads 31 of the conductive portion 3. The conductive bonding paste is, for example, an Ag paste, a solder paste, or the like. Next, the leads 53 of the control device 50 are attached to the conductive bonding paste. Also, the control chip 5b is attached to the conductive bonding paste printed on the pad 31e. Next, the leads 53 and the control chip 5b of the control device 50 are bonded to respective pads 31 via the conductive bonding material by heating and then cooling the conductive bonding paste, for example. Further, the thermistors 6a and 6b and the other passive elements 6 are bonded to respective pads 31 of the conductive portion 3 via the conductive bonding material through a similar step.

In the wire connecting step (step S5), first, the plurality of wires 71 are connected. In this example, wire materials made of aluminum (Al) are sequentially connected by means of a wedge bonding method, for example. In the present embodiment, a leading end of each wire material is bonded to the source electrode 43 of the semiconductor chip 4a, a capillary is moved while pulling out the wire material to bond the wire material to the anode electrode 93 of the protective element 9a, and the capillary is further moved while pulling out the wire material to bond the wire material to the wire bonding portion 134 of the lead 13, thereby connecting wires 71. Similarly, wires 71 are connected by sequentially bonding wire materials to the source electrode 43 of the semiconductor chip 4b, the anode electrode 93 of the protective element 9b, and the wire bonding portion 144 of the lead 14. Thus, the plurality of wires 71 are obtained. Next, the plurality of wires 72, 73, and 74 are connected. In this example, wire materials made of gold (Au) are sequentially connected by means of a capillary bonding method, for example. Thus, the plurality of wires 72, 73, and 74 are obtained.

In the resin forming step (step S6), for example, a part of the lead frame, a part of the substrate 2, the semiconductor chips 4a and 4b, the protective elements 9a and 9b, the control device 50 (control chip 5a), the control chip 5b, the plurality of passive elements 6, and the plurality of wires 71 to 74 are enclosed by a mold. Next, a liquid resin material is injected into a space defined by the mold. Subsequently, this resin material is cured, and the sealing resin 8 is thus obtained.

In the frame cutting step (step S7), appropriate portions of a part of the lead frame that is exposed from the sealing resin 8 are cut. Thus, the plurality of leads 1 are divided. Thereafter, the plurality of leads 1 are bent or otherwise processed as necessary to obtain the above-described semiconductor device A1.

Next, the operation and effects of the semiconductor device A1 will be described.

According to the present embodiment, the thermistor 6a is arranged adjacent to the mounting portion 111 of the lead 11 on which the semiconductor chip 4a is mounted, and detects the temperature of the semiconductor chip 4a. The thermistor 6b is arranged adjacent to the mounting portion 121 of the lead 12 on which the semiconductor chip 4*b* is mounted, and detects the temperature of the semiconductor chip 4*b*. Accordingly, even if a current unevenly flows through the semiconductor chips 4*a* and 4*b* and causes a temperature difference, the respective temperatures can be separately detected and compared properly with the design temperature. This configuration makes it possible to suppress thermal runaway. Further, the thermistors 6*a* and 6*b* are mounted on the substrate obverse surface 21 of the substrate 2. Accordingly, the thermistors 6*a* and 6*b* are less affected by noise caused by switching of the semiconductor chips 4*a* and 4*b* than in the case where temperature detection units are incorporated into the semiconductor chips 4*a* and 4*b*.

According to the present embodiment, the conductive portion 3 is formed on the substrate obverse surface 21 of the substrate 2. The conductive portion 3 has the pads 31 to which the control device 50 and the control chip 5*b* are conductively bonded. This configuration enables conduction paths to the control device 50 and the control chip 5*b* to be constituted by the conductive portion 3 formed on the substrate obverse surface 21. Accordingly, it is possible to make the conduction paths thinner and denser than in the case of constituting the conduction paths with metal leads, for example.

According to the present embodiment, the plurality of leads 1 have a higher thermal conductivity than that of the substrate 2, and can therefore suppress a decrease in heat dissipation from the semiconductor chips 4 that may deteriorate as a result of employing the substrate 2. Further, the semiconductor chip 4*a* is directly bonded to the lead 11 by the conductive bonding material, and the semiconductor chip 4*b* is directly bonded to the lead 12 by the conductive bonding material. Accordingly, the semiconductor chip 4*a* (4*b*) can be made electrically continuous with the lead 11 (12), and heat from the semiconductor chip 4*a* (4*b*) can be efficiently transmitted to the lead 11 (12). Since the plurality of leads 1 are exposed from the sealing resin 8, it is possible to form the conduction paths to the semiconductor chips 4 from the outside and further ensure heat dissipation characteristics of the semiconductor chips 4. The bonding portions 25 are formed on the substrate 2, and the leads 11 and 12 are bonded to the substrate 2 via the bonding portions 25. For example, the surfaces of the bonding portions 25 can be finished more smoothly relative to the surface roughness of the substrate obverse surface 21 of the substrate 2, which is made of ceramic. This configuration makes it possible to suppress generation of an unintended minute gap or the like in heat transfer paths from the leads 11 and 12 to the substrate 2, and further promote heat dissipation of the semiconductor chips 4 and other members. The substrate reverse surface 22 of the substrate 2 is exposed from the sealing resin 8. This configuration allows heat transferred from the semiconductor chips 4 or other members to the substrate 2 to be more efficiently dissipated to the outside.

According to the present embodiment, the conductive portion 3 and the bonding portions 25 contain the same conductive material. Therefore, the conductive portion 3 and the bonding portions 25 can be collectively formed on the substrate 2. This is preferable to improving production efficiency of the semiconductor device A1. The plurality of leads 15 are bonded to the pads 31 of the conductive portion 3 via the conductive bonding material 76. This configuration allows the plurality of leads 15 to be more firmly fixed to the substrate 2. In addition, the resistance between the plurality of leads 15 and the conductive portion 3 can be lowered.

According to the present embodiment, the control chip 5*a* and the control chip 5*b* are arranged on the substrate obverse surface 21 between the lead 11, on which the semiconductor chip 4*a* is arranged, and the lead 12, on which the semiconductor chip 4*b* is arranged. Accordingly, the difference between the distance from the control chip 5*a* to the semiconductor chip 4*a* and the distance from the control chip 5*b* to the semiconductor chip 4*b* can be reduced. As a result, the difference in transmission time between the drive signal input from the control chip 5*a* to the semiconductor chip 4*a* and the drive signal input from the control chip 5*b* to the semiconductor chip 4*b* can be reduced.

Note that the present embodiment has described the case where the semiconductor device A1 includes two temperature detection elements, namely the thermistor 6*a* for detecting the temperature of the semiconductor chip 4*a* and the thermistor 6*b* for detecting the temperature of the semiconductor chip 4*b*. However, this need not be the case. The semiconductor device A1 may include a larger number of temperature detection elements than the number of semiconductor chips 4.

FIGS. 10 to 14 show other embodiments of the present disclosure. Note that, in these figures, the same or similar elements as those in the above embodiment are assigned the same reference signs in the above embodiment.

Figure 10:
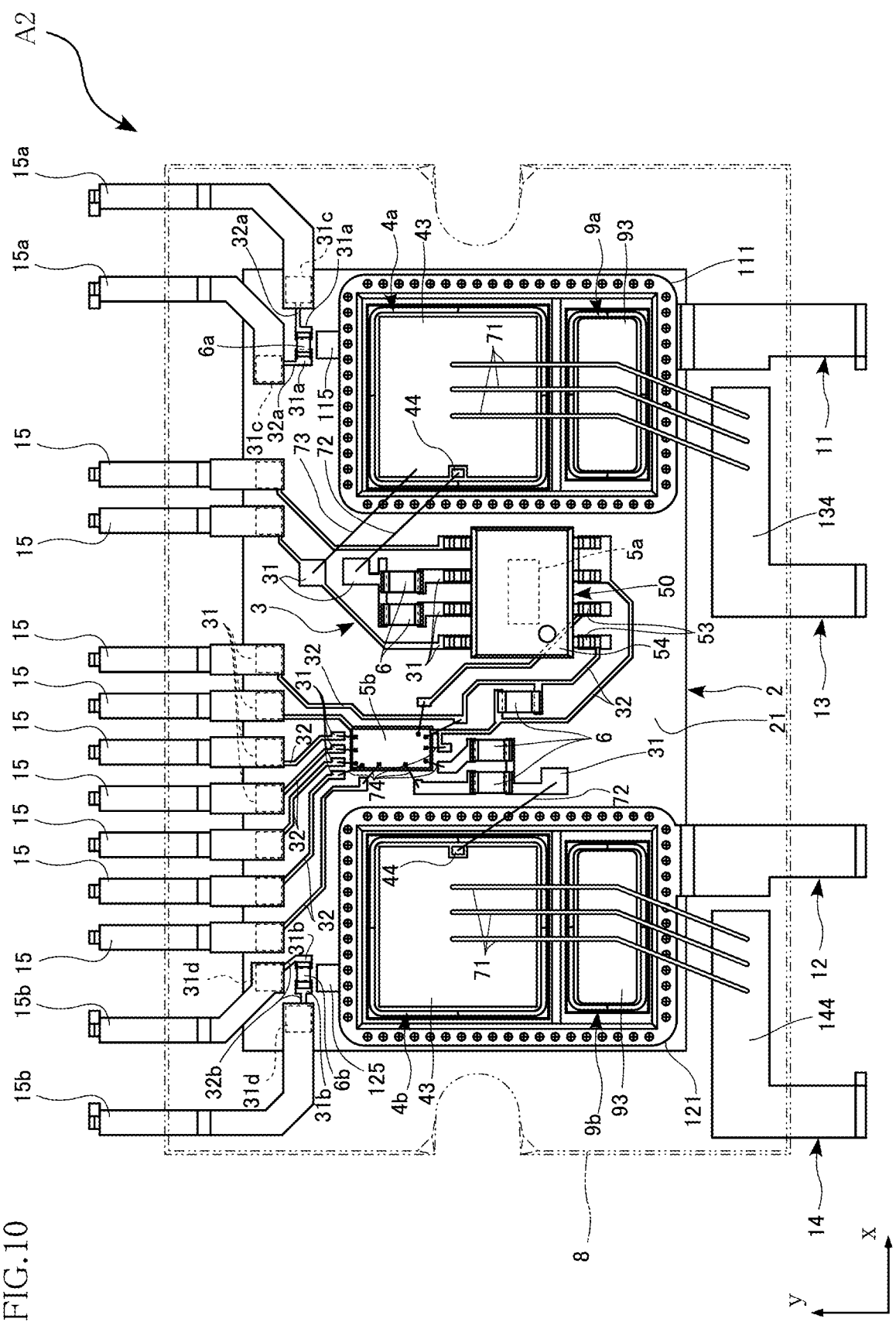
FIG. 10 is a plan view of a semiconductor device according to a second embodiment of the present disclosure, with the sealing resin shown in a transparent manner.

FIG. 10 is a diagram for illustrating a semiconductor device A2 according to the second embodiment of the present disclosure. FIG. 10 is a plan view of the semiconductor device A2 and corresponds to FIG. 3. FIG. 10 shows the sealing resin 8 in a transparent manner, and indicates the outer shape of the sealing resin 8 with imaginary lines (dash-double dot lines), as FIG. 3 does. The semiconductor device A2 of the present embodiment is different from the first embodiment in the positions at which the thermistors 6*a* and 6*b* are arranged and the shapes of the leads 11 and 12.

In the semiconductor device A2 according to the present embodiment, the thermistors 6*a* and 6*b* are arranged closer to an edge on one side in the y direction (upper edge in FIG. 10) of the substrate obverse surface 21 than in the case of semiconductor device A1. That is, compared with the semiconductor device A1, the thermistor 6*a* is arranged away from the mounting portion 111 of the lead 11, and the thermistor 6*b* is arranged away from the mounting portion 121 of the lead 12.

The lead 11 further includes an extended portion 115 that extends from the mounting portion 111 toward the thermistor 6*a* in the y direction. That is, the thermistor 6*a* is arranged close to a leading end of the extended portion 115. The thermistor 6*a* is kept away from the mounting portion 111 and the semiconductor chip 4*a* mounted on the mounting portion 111, but is adjacent to the lead 11 due to the presence of the extension unit 115. Accordingly, heat generated by the semiconductor chip 4*a* is transmitted to the thermistor 6*a* via the lead 11.

The lead 12 further includes an extended portion 125 that extends from the mounting portion 121 toward the thermistor 6*b* in the y direction. That is, the thermistor 6*b* is arranged close to a leading end of the extended portion 125. The thermistor 6*b* is kept away from the mounting portion 121 and the semiconductor chip 4*b* mounted on the mounting portion 121, but is adjacent to the lead 12 due to the presence of the extension unit 125. Accordingly, heat generated by the semiconductor chip 4*b* is transmitted to the thermistor 6*b* via the lead 12.

According to the present embodiment, the thermistor 6*a* is arranged adjacent to the extended portion 115 extending from the mounting portion 111 of the lead 11 on which the semiconductor chip 4a is mounted, and detects the temperature of the semiconductor chip 4a. The thermistor 6b is arranged adjacent to the extended portion 125 extending from the mounting portion 121 of the lead 12 on which the semiconductor chip 4b is mounted, and detects the temperature of the semiconductor chip 4b. Accordingly, the temperatures can be separately detected, and thermal runaway can therefore be suppressed. The thermistors 6a and 6b are mounted on the substrate obverse surface 21 of the substrate 2, and are therefore unlikely to be affected by noise caused by switching of the semiconductor chips 4a and 4b. Furthermore, according to the present embodiment, the thermistor 6a (6b) is kept further away from the semiconductor chip 4a (4b) than in the semiconductor device A1. Accordingly, the thermistors 6a and 6b are less affected by noise caused by switching of the semiconductor chips 4a and 4b.

Figure 11:
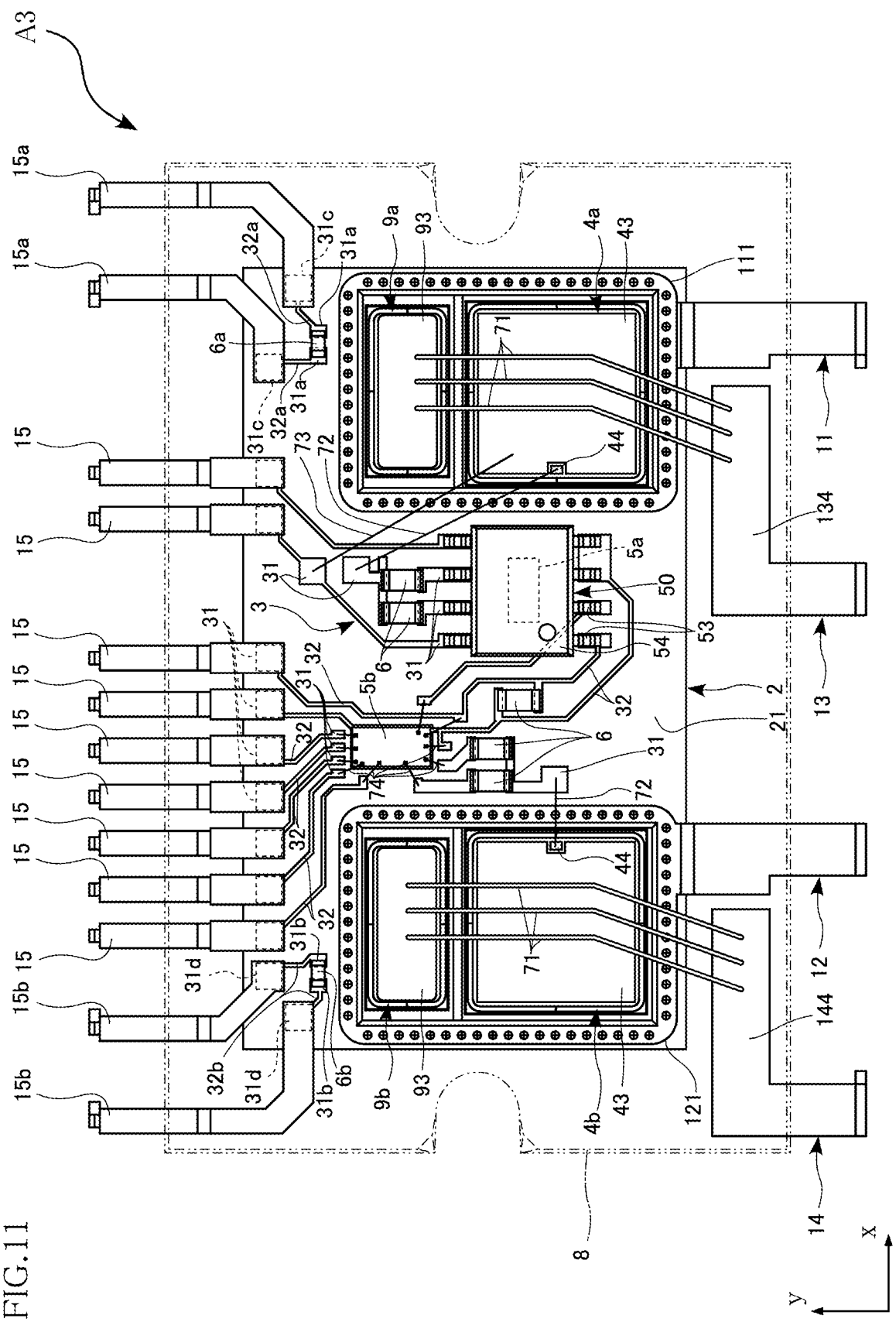
FIG. 11 is a plan view of a semiconductor device according to a third embodiment of the present disclosure, with the sealing resin shown in a transparent manner.

FIG. 11 is a diagram for illustrating a semiconductor device A3 according to the third embodiment of the present disclosure. FIG. 11 is a plan view of the semiconductor device A3 and corresponds to FIG. 3. FIG. 11 shows the sealing resin 8 in a transparent manner, and indicates the outer shape of the sealing resin 8 with imaginary lines (dash-double dot lines), as FIG. 3 does. The semiconductor device A3 of the present embodiment is different from the first embodiment in the positions at which the semiconductor chips 4 and the protective elements 9 are arranged.

In the semiconductor device A3 according to the present embodiment, the positions at which the semiconductor chip 4a and the protective element 9a are arranged are switched, and the positions at which the semiconductor chip 4b and the protective element 9b are arranged are switched. That is, the protective element 9a is arranged on the lead 11 on the other side in the y direction (upper side in FIG. 11) of the semiconductor chip 4a, and the protective element 9b is arranged on the lead 12 on the other side in the y direction of the semiconductor chip 4b. That is, the thermistor 6a is arranged on the opposite side to the semiconductor chip 4a with respect to the protective element 9a, and the thermistor 6b is arranged on the opposite side to the semiconductor chip 4b with respect to the protective element 9b.

In the present embodiment as well, the thermistor 6a is arranged adjacent to the mounting portion 111 of the lead 11 on which the semiconductor chip 4a is mounted, and detects the temperature of the semiconductor chip 4a. The thermistor 6b is arranged adjacent to the mounting portion 121 of the lead 12 on which the semiconductor chip 4b is mounted, and detects the temperature of the semiconductor chip 4b. Accordingly, the temperatures can be separately detected, and thermal runaway can therefore be suppressed. The thermistors 6a and 6b are mounted on the substrate obverse surface 21 of the substrate 2, and are therefore unlikely to be affected by noise caused by switching of the semiconductor chips 4a and 4b. Furthermore, according to the present embodiment, the thermistor 6a (6b) is kept further away from the semiconductor chip 4a (4b) than in the semiconductor device A1. Accordingly, the thermistors 6a and 6b are less affected by noise caused by switching of the semiconductor chips 4a and 4b.

Figure 12:
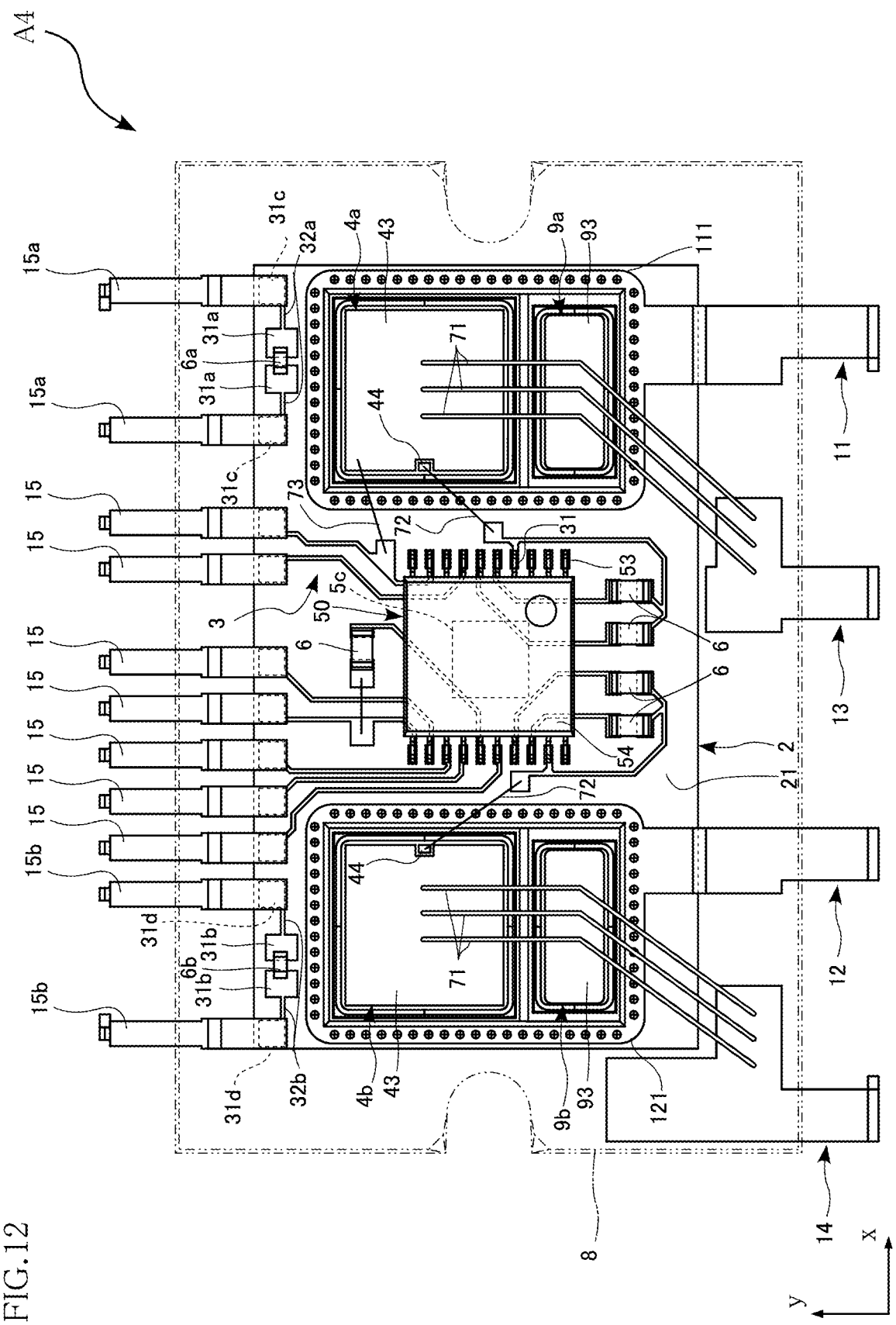
FIG. 12 is a plan view of a semiconductor device according to a fourth embodiment of the present disclosure, with the sealing resin shown in a transparent manner.

FIG. 12 is a diagram for illustrating a semiconductor device A4 according to the fourth embodiment of the present disclosure. FIG. 12 is a plan view of the semiconductor device A4 and corresponds to FIG. 3. FIG. 12 shows the sealing resin 8 in a transparent manner, and indicates the outer shape of the sealing resin 8 with imaginary lines (dash-double dot lines), as FIG. 3 does. The semiconductor device A4 of the present embodiment is different from the first embodiment in that a control device 50 having one control chip 5c is provided instead of the control device 50 (control chip 5a) and the control chip 5b.

The control chip 5c generates a drive signal for the semiconductor chip 4a and a drive signal for the semiconductor chip 4b, and outputs the generated signals to the respective semiconductor chips. In the present embodiment, the control chip 5c constitutes the control device 50 together with a die pad and a plurality of wires (not shown), a plurality of leads 53, and a resin 54. The leads 53 are arranged on both ends in the x direction of the resin 54, spaced apart from each other in the y direction. The leads 53 extend in the x direction, and a part of each lead 53 protrudes from one of the two side faces in the x direction of the resin 54. The portion of each lead 53 that protrudes from the resin 54 is conductively bonded to a corresponding pad 31 of the conductive portion 3. In the present embodiment, the control device 50 is an SOP package. Note that the package type of the control device 50 is not specifically limited. Note that the control chip 5c may alternatively be arranged as-is on the substrate obverse surface 21 without constituting the control device 50.

The semiconductor device A4 according to the fourth embodiment employs the control device 50 having the control chip 5c, and is therefore different from the semiconductor device A1 in the arrangement of the passive elements 6 and the arrangement and the shape of the conductive portion 3. In addition, the shapes of the leads 13 and 14 and the shapes and the arrangement of the leads 15a and 15b are also different.

In the present embodiment as well, the thermistor 6a is arranged adjacent to the mounting portion 111 of the lead 11 on which the semiconductor chip 4a is mounted, and detects the temperature of the semiconductor chip 4a. The thermistor 6b is arranged adjacent to the mounting portion 121 of the lead 12 on which the semiconductor chip 4b is mounted, and detects the temperature of the semiconductor chip 4b. Accordingly, the temperatures can be separately detected, and thermal runaway can therefore be suppressed. The thermistors 6a and 6b are mounted on the substrate obverse surface 21 of the substrate 2, and are therefore unlikely to be affected by noise caused by switching of the semiconductor chips 4a and 4b.

Figure 13:
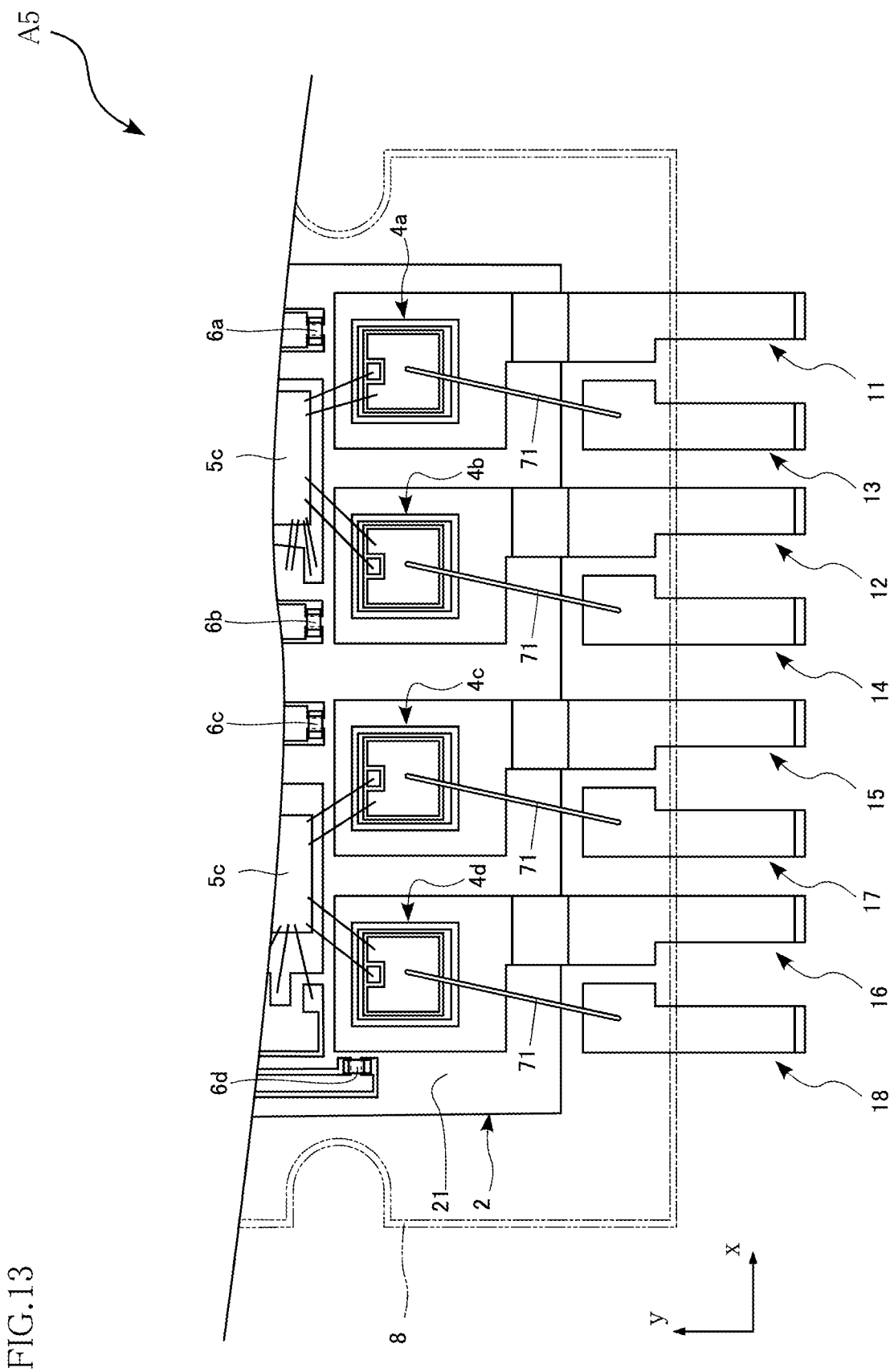
FIG. 13 is a plan view of a semiconductor device according to a fifth embodiment of the present disclosure, with the sealing resin shown in a transparent manner.

FIG. 13 is a diagram for illustrating a semiconductor device A5 according to the fifth embodiment of the present disclosure. FIG. 13 is a plan view of the semiconductor device A5, with the sealing resin 8 shown in a transparent manner. Note that FIG. 13 shows the outer shape of the sealing resin 8 with imaginary lines (dash-double dot lines). The semiconductor device A5 of the present embodiment is different from the first embodiment in that the semiconductor device A5 includes four semiconductor chips 4a to 4d.

Compared with the semiconductor device A1, the semiconductor device A5 according to the present embodiment further includes leads 16 to 19, semiconductor chips 4c and 4d, and thermistors 6c and 6d. The semiconductor device A5 also includes two control chips 5c according to the third embodiment. The leads 16 and 17 are the same as the leads 11 and 12. The leads 18 and 19 are the same as the leads 13 and 14. The semiconductor chips 4c and 4d are the same as the semiconductor chips 4a and 4b. The semiconductor chip 4c is mounted on the lead 16, and is connected to the lead 18 by a wire 71. The semiconductor chip 4d is mounted on the lead 17, and is connected to the lead 19 by a wire 71. One of the control chips 5c generates a drive signal for the semiconductor chip 4a and a drive signal for the semiconductor chip 4b and outputs the generated drive signals to the respective semiconductor chips to control the drive of the semiconductor chips 4a and 4b. The other one of the control chips 5c generates a drive signal for the semiconductor chip 4c and a drive signal for the semiconductor chip 4d and outputs the generated drive signals to the respective semiconductor chips to control the drive of the semiconductor chips 4c and 4d.

The thermistors 6c and 6d are the same as the thermistors 6a and 6b. The thermistor 6c is arranged adjacent to a mounting portion of the lead 16 on which the semiconductor chip 4c is mounted, and detects the temperature of the semiconductor chip 4c. The thermistor 6d is arranged adjacent to a mounting portion of the lead 17 on which the semiconductor chip 4d is mounted, and detects the temperature of the semiconductor chip 4d. That is, the semiconductor device A5 has four semiconductor chips, and therefore includes four thermistors for detecting the temperatures of the respective semiconductor chips.

According to the present embodiment, the thermistor 6a is arranged adjacent to the mounting portion 111 of the lead 11 on which the semiconductor chip 4a is mounted, and detects the temperature of the semiconductor chip 4a. The thermistor 6b is arranged adjacent to the mounting portion 121 of the lead 12 on which the semiconductor chip 4b is mounted, and detects the temperature of the semiconductor chip 4b. The thermistor 6c is arranged adjacent to the mounting portion of the lead 16 on which the semiconductor chip 4c is mounted, and detects the temperature of the semiconductor chip 4c. The thermistor 6d is arranged adjacent to the mounting portion of the lead 17 on which the semiconductor chip 4d is mounted, and detects the temperature of the semiconductor chip 4d. Accordingly, the temperatures can be separately detected, and thermal runaway can therefore be suppressed. The thermistors 6a to 6d are mounted on the substrate obverse surface 21 of the substrate 2, and are therefore unlikely to be affected by noise caused by switching of the semiconductor chips 4a to 4d.

Note that the present embodiment has described the case where four semiconductor chips are provided, whereas the first to fourth embodiments have described the case where two semiconductor chips are provided. However, this need not be the case. The number of semiconductor chips may be three, or may be five or more. The number of thermistors may be determined in accordance with the number of semiconductor chips. Further, the number of thermistors may be greater than the number of semiconductor chips.

Figure 14:
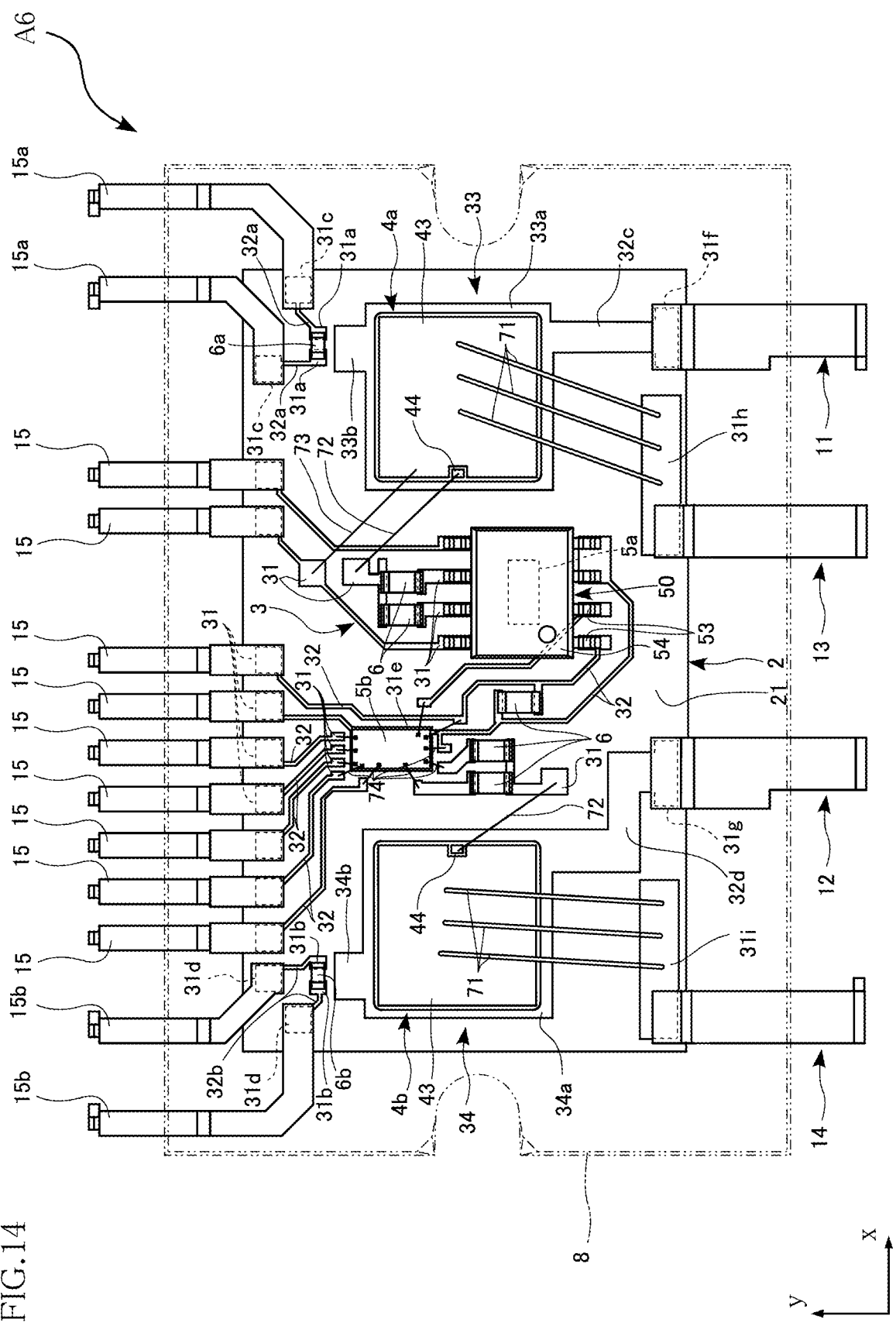
FIG. 14 is a plan view of a semiconductor device according to a sixth embodiment of the present disclosure, with the sealing resin shown in a transparent manner.

FIG. 14 is a diagram for illustrating a semiconductor device A6 according to the sixth embodiment of the present disclosure. FIG. 14 is a plan view of the semiconductor device A6, with the sealing resin 8 shown in a transparent manner. Note that FIG. 14 shows the outer shape of the sealing resin 8 with imaginary lines (dash-double dot lines). The semiconductor device A6 of the present embodiment is different from the first embodiment in that the semiconductor chips 4a and 4b are not mounted on the leads 1 but are arranged on the conductive portion 3.

In the semiconductor device A6 according to the present embodiment, the conductive portion 3 further includes a first conductive portion 33 and a second conductive portion 34. The first conductive portion 33 is spaced apart from the second conductive portion 34. The first conductive portion 33 includes a mounting portion 33a and an extended portion 33b. The semiconductor chip 4a is mounted on the mounting portion 33a. The semiconductor chip 4a is bonded to the mounting portion 33a by a conductive bonding material (not shown), with the element reverse surface 42 facing toward the mounting portion 33a. Thus, the drain electrode 45 of the semiconductor chip 4a is conductively connected to the mounting portion 33a by the conductive bonding material. The extended portion 33b is a portion extending from the mounting portion 33a toward the thermistor 6a in the y direction. That is, the thermistor 6a is arranged close to a leading end of the extended portion 33b. The thermistor 6a is arranged insulated from the first conductive portion 33. Note the first conductive portion 33 need not include the extended portion 33b. In this case, the thermistor 6a may be arranged adjacent to the mounting portion 33a.

Similarly, the second conductive portion 34 includes a mounting portion 34a and an extended portion 34b. The semiconductor chip 4b is mounted on the mounting portion 34a. The semiconductor chip 4b is bonded to the mounting portion 34a by a conductive bonding material (not shown), with the element reverse surface 42 toward the mounting portion 34a. Thus, the drain electrode 45 of the semiconductor chip 4b is conductively connected to the mounting portion 34a by the conductive bonding material. The extended portion 34b is a portion extending from the mounting portion 34a toward the thermistor 6b in the y direction. That is, the thermistor 6b is arranged close to a leading end of the extended portion 34b. The thermistor 6b is arranged, insulated from the second conductive portion 34. Note the second conductive portion 34 need not include the extended portion 34b. In this case, the thermistor 6b may be arranged adjacent to the mounting portion 34a.

The conductive portion 3 further includes pads 31f, 31g, 31h, and 31i, and interconnects 32c and 32d. The lead 11 is conductively bonded to the pad 31f, and the lead 12 is conductively bonded to the pad 31g. The lead 13 is conductively bonded to the pad 31h, and is conductively connected to the source electrode 43 of the semiconductor chip 4a by wires 71. The lead 14 is conductively bonded to the pad 31i, and is conductively connected to the source electrode 43 of the semiconductor chip 4b by wires 71. The interconnect 32c is connected to the first conductive portion 33 and the pad 31f and serves as a conduction path between the first conduction portion 33 and the pad 31f. The interconnect 32d is connected to the second conductive portion 34 and the pad 31g and serves as a conduction path between the second conductive portion 34 and the pad 31g.

According to the present embodiment, the thermistor 6a is arranged adjacent to the extended portion 33b extending from the mounting portion 33a of the first conductive portion 33 on which the semiconductor chip 4a is mounted, and detects the temperature of the semiconductor chip 4a. The thermistor 6b is arranged adjacent to the extended portion 34b extending from the mounting portion 34a of the second conductive portion 34 on which the semiconductor chip 4b is mounted, and detects the temperature of the semiconductor chip 4b. Accordingly, the temperatures can be separately detected, and thermal runaway can therefore be suppressed. The thermistors 6a and 6b are mounted on the substrate obverse surface 21 of the substrate 2, and are therefore unlikely to be affected by noise caused by switching of the semiconductor chips 4a and 4b.

The first to sixth embodiments have described the case where the semiconductor devices A1 to A6 are IPMs, but this need not be the case. The semiconductor device according to the present disclosure may be any semiconductor device other than an IPM.

The semiconductor device according to the present disclosure is not limited to the above-described embodiments. The specific configuration of each part of the semiconductor device according to the present may be freely designed and changed in various manners. The present disclosure includes embodiments described in the following clauses.

Clause 1.
    A semiconductor device comprising:
        a substrate including a substrate obverse surface and a substrate reverse surface that face opposite sides in a thickness direction;
        a conductive portion formed on the substrate obverse surface;
        a sealing resin covering at least a part of the substrate and an entirety of the conductive portion;
        a plurality of semiconductor chips disposed on the substrate obverse surface; and
        a plurality of temperature detection elements disposed on the substrate obverse surface, wherein the number of the temperature detection elements is equal to or greater than the number of the semiconductor chips.

Clause 2.
    The semiconductor device described in Clause 1, wherein the plurality of semiconductor chips include a first semiconductor chip and a second semiconductor chip,
        the plurality of temperature detection elements include a first temperature detection element and a second temperature detection element,
        the first temperature detection element is disposed at a position closer to the first semiconductor chip than the second temperature detection element is, and
        the second temperature detection element is disposed at a position closer to the second semiconductor chip than the first temperature detection element is.

Clause 3.
    The semiconductor device described in Clause 2, further including a first lead and a second lead that are spaced apart from each other on the substrate obverse surface and have a higher thermal conductivity than that of the substrate,
        wherein the first semiconductor chip is disposed on the first lead, and
        the second semiconductor chip is disposed on the second lead.

Clause 4.
    The semiconductor device according to Clause 3, wherein the first temperature detection element is adjacent to the first lead and insulated from the first lead, and
        the second temperature detection element is adjacent to the second lead and insulated from the second lead.

Clause 5.
    The semiconductor device according to Clause 4, further comprising an electronic component disposed on the first lead,
        wherein the first temperature detection element is disposed opposite to the first semiconductor chip with respect to the element component.

Clause 6.
    The semiconductor device according to Clause 4 or 5, wherein the first lead includes a mounting portion on which the first semiconductor chip is mounted, and an extended portion extending from the mounting portion, and
        the first temperature detection element is close to a leading end of the extended portion.

Clause 7.
    The semiconductor device according to any one of Clauses 3 to 6, further comprising a bonding portion formed on the substrate obverse surface and including a same conductive material as the conductive portion,
        wherein the first lead and the second lead are bonded to the bonding portion via a bonding material.

Clause 8.
    The semiconductor device according to any one of Clauses 3 to 7, wherein a part of the first lead and a part of the second lead are covered by the sealing resin, and another part of the first lead and another part of the second lead are exposed from the sealing resin.

Clause 9.
    The semiconductor device according to any one of Clauses 3 to 8, further comprising a control lead spaced apart from the first lead and the second lead and bonded to the conductive portion via a conductive bonding material,
        wherein a part of the control lead is covered by the sealing resin and another part of the control lead is exposed from the sealing resin.

Clause 10.
    The semiconductor device according to Clause 2, wherein the conductive portion includes a first conductive portion and a second conductive portion that are spaced apart from each other,
        the first semiconductor chip is disposed on the first conductive portion,
        the second semiconductor chip is disposed on the second conductive portion,
        the first temperature detection element is adjacent to the first conductive portion and insulated from the first conductive portion, and
        the second temperature detection element is adjacent to the second conductive portion and insulated from the second conductive portion.

Clause 11.
    The semiconductor device according to Clause 10, wherein the first conductive portion includes a mounting portion on which the first semiconductor chip is mounted, and an extended portion extending from the mounting portion, and
        the first temperature detection element is close to a leading end of the extended portion.

Clause 12.
    The semiconductor device according to any one of Clauses 1 to 11, wherein the temperature detection elements comprise thermistors.

Clause 13.
    The semiconductor device according to any one of Clauses 1 to 11, wherein the temperature detection elements comprise semiconductor temperature sensors.

Clause 14.
    The semiconductor device according to any one of Clauses 1 to 13, wherein the number of semiconductor chips and the number of temperature detection elements are each two.

Clause 15.
    The semiconductor device according to any one of Clauses 1 to 13, wherein the number of semiconductor chips and the number of temperature detection elements are each four.

Clause 16.
    The semiconductor device according to any one of Clauses 1 to 15, wherein the semiconductor chips comprise power transistors for controlling electric power.

Clause 17.
    The semiconductor device according to any one of Clauses 1 to 16, wherein each of the semiconductor chips includes:
        a chip obverse surface and a chip reverse surface that face opposite sides in the thickness direction;
        an obverse-surface electrode disposed on the chip obverse surface; and
        a reverse-surface electrode disposed on the chip reverse surface.

Clause 18.

The semiconductor device according to any one of Clauses 1 to 17, wherein the substrate reverse surface is exposed from the sealing resin.

Clause 19.

The semiconductor device according to any one of Clauses 1 to 18, wherein the substrate is made of ceramic.

REFERENCE NUMERALS

A1, A2, A3, A4, A5, A6: Semiconductor device
1, 11 to 19, 15a, 15b: Lead
111: Mounting portion
111a: Obverse surface
111b: Reverse surface
112: Protruding portion
113: Inclined connecting portion
114: Parallel connecting portion
115: Extended portion
121: Mounting portion
121a: Obverse surface
121b: Reverse surface
122: Protruding portion
123: Inclined connecting portion
124: Parallel connecting portion
125: Extended portion
132: Protruding portion
134: Wire bonding portion
142: Protruding portion
144: Wire bonding portion
151: Bonding section
151a: Obverse surface
151b: Reverse surface
152: Protruding portion
153: Inclined connecting portion
154: Parallel connecting portion
2: Substrate
21: Substrate obverse surface
22: Substrate reverse surface
25, 251, 252: Bonding portion
3: Conductive portion
31, 31a to 32i: Pad
32, 32a to 32d: Interconnect
33: First conductive portion
33a: Mounting portion
33b: Extended portion
34: Second conductive portion
34a: Mounting portion
34b: Extended portion
4, 4a, 4b, 4c, 4d: Semiconductor chip
41: Element obverse surface
42: Element reverse surface
43: Source electrode
44: Gate electrode
45: Drain electrode
5, 5a, 5b, 5c: Control chip
50: Control device
53: Lead
54: Resin
6: Passive element
6a to 6d: Thermistor
71 to 74: Wire
75: Bonding material
76: Conductive bonding material
8: Sealing resin
81: Resin obverse surface
82: Resin reverse surface
83: Resin side surface
9, 9a, 9b: Protective element
91: Protective element obverse surface
92: Protective element reverse surface
93: Anode electrode
94: Cathode electrode

The invention claimed is:

1. A semiconductor device comprising:
a substrate including a substrate obverse surface and a substrate reverse surface that face opposite sides in a thickness direction;
a conductive portion formed on the substrate obverse surface;
a sealing resin covering at least a part of the substrate and an entirety of the conductive portion;
a plurality of semiconductor chips disposed on the substrate obverse surface; and
a plurality of temperature detection elements disposed on the substrate obverse surface, wherein a number of the temperature detection elements is equal to or greater than a number of the semiconductor chips,
wherein the plurality of semiconductor chips include a first semiconductor chip and a second semiconductor chip,
the plurality of temperature detection elements include a first temperature detection element and a second temperature detection element,
the first temperature detection element is disposed at a position closer to the first semiconductor chip than the second temperature detection element is,
the second temperature detection element is disposed at a position closer to the second semiconductor chip than the first temperature detection element is,
the semiconductor device further includes a first lead and a second lead that are spaced apart from each other and have a higher thermal conductivity than that of the substrate,
the first lead includes a first lead obverse surface and a first lead reverse surface that face away from each other, the first lead being bonded to the substrate obverse surface via the first lead reverse surface, the first semiconductor chip being mounted on the first lead obverse surface, and
the second lead includes a second lead obverse surface and a second lead reverse surface that face away from each other, the second lead being bonded to the substrate obverse surface via the second lead reverse surface, the second semiconductor chip being mounted on the second lead obverse surface.

2. The semiconductor device according to claim 1, wherein the first temperature detection element is adjacent to the first lead and insulated from the first lead, and
the second temperature detection element is adjacent to the second lead and insulated from the second lead.

3. The semiconductor device according to claim 2, further comprising an electronic component disposed on the first lead,
wherein the first temperature detection element is disposed opposite to the first semiconductor chip with respect to the electronic component, and
the first semiconductor chip is disposed between the first temperature detection element and the electronic component as viewed in the thickness direction.

4. The semiconductor device according to claim 2, wherein the first lead includes a mounting portion on which the first semiconductor chip is mounted, and an extended portion extending from the mounting portion, and
the first temperature detection element is close to a leading end of the extended portion.

5. The semiconductor device according to claim 1, further comprising a bonding portion formed on the substrate obverse surface and including a same conductive material as the conductive portion,
wherein the first lead and the second lead are bonded to the bonding portion via a bonding material.

6. The semiconductor device according to claim 1, wherein a part of the first lead and a part of the second lead are covered by the sealing resin, and another part of the first lead and another part of the second lead are exposed from the sealing resin.

7. The semiconductor device according to claim 1, further comprising a control lead spaced apart from the first lead and the second lead and bonded to the conductive portion via a conductive bonding material,
wherein a part of the control lead is covered by the sealing resin and another part of the control lead is exposed from the sealing resin.

8. The semiconductor device according to claim 1, wherein the conductive portion includes a first conductive portion and a second conductive portion that are spaced apart from each other,
the first semiconductor chip is disposed on the first conductive portion,
the second semiconductor chip is disposed on the second conductive portion, the first temperature detection element is adjacent to the first conductive portion and insulated from the first conductive portion, and the second temperature detection element is adjacent to the second conductive portion and insulated from the second conductive portion.

9. The semiconductor device according to claim 8, wherein the first conductive portion includes a mounting portion on which the first semiconductor chip is mounted, and an extended portion extending from the mounting portion, and the first temperature detection element is close to a leading end of the extended portion.

10. The semiconductor device according to claim 1, wherein the temperature detection elements comprise thermistors.

11. The semiconductor device according to claim 1, wherein the temperature detection elements comprise semiconductor temperature sensors.

12. The semiconductor device according to claim 1, wherein the number of semiconductor chips and the number of temperature detection elements are each two.

13. The semiconductor device according to claim 1, wherein the number of semiconductor chips and the number of temperature detection elements are each four.

14. The semiconductor device according to claim 1, wherein the semiconductor chips comprise power transistors for controlling electric power.

15. The semiconductor device according to claim 1, wherein each of the semiconductor chips includes:
- a chip obverse surface and a chip reverse surface that face opposite sides in the thickness direction;
- an obverse-surface electrode disposed on the chip obverse surface; and
- a reverse-surface electrode disposed on the chip reverse surface.

16. The semiconductor device according to claim 1, wherein the substrate reverse surface is exposed from the sealing resin.

17. The semiconductor device according to claim 1, wherein the substrate is made of ceramic.

* * * * *